US012745589B2

(12) United States Patent
Yamamoto et al.

(10) Patent No.: US 12,745,589 B2
(45) Date of Patent: Sep. 22, 2026

(54) INFORMATION PROCESSING SYSTEM, POWER ADJUSTMENT METHOD, AND HEAT TREATMENT APPARATUS

(71) Applicant: Tokyo Electron Limited, Tokyo (JP)

(72) Inventors: Masakazu Yamamoto, Iwate (JP); Tadashi Enomoto, Iwate (JP); Hiroyuki Karasawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 409 days.

(21) Appl. No.: 18/229,471

(22) Filed: Aug. 2, 2023

(65) Prior Publication Data

US 2024/0063034 A1 Feb. 22, 2024

(30) Foreign Application Priority Data

Aug. 19, 2022 (JP) ................................ 2022-131130

(51) Int. Cl.
*H01L 21/67* (2006.01)
*H10P 72/00* (2026.01)

(52) U.S. Cl.
CPC ...... *H10P 72/0434* (2026.01); *H10P 72/0462* (2026.01); *H10P 72/0602* (2026.01); *H10P 72/0604* (2026.01)

(58) Field of Classification Search
CPC ........... H01L 21/67109; H01L 21/6719; H01L 21/67248; H01L 21/67253; H01L 21/67103; H01L 21/02255; H01L 21/67242; H01L 21/67303; C23C 16/52; C23C 16/45546; C23C 16/46; G05B 13/048; G05B 19/41885; Y02P 90/02; H10P 72/0434; H10P 72/0462; H10P 72/0602; H10P 72/0604; H10P 72/0432; H10P 14/6322; H10P 72/06; H10P 72/12
See application file for complete search history.

(56) References Cited

U.S. PATENT DOCUMENTS 6,207,936 B1 * 3/2001 de Waard ........... G05D 23/1917 219/486
2013/0037534 A1 * 2/2013 Yoshii ............... H01L 21/67781 219/494
2013/0204416 A1 * 8/2013 Takahashi ......... H01L 21/67248 700/95

FOREIGN PATENT DOCUMENTS

JP 2021-132140 A 9/2021

* cited by examiner

*Primary Examiner* — Ermias T Woldegeorgis
(74) *Attorney, Agent, or Firm* — Venjuris, P.C.

(57) ABSTRACT

An information processing system includes a heat treatment apparatus that forms a film on a processing target substrate by using a heating unit that heats the processing target substrate inside a processing container, and an information processing apparatus that controls power supplied to the heating part, the information processing system comprising a prediction unit configured to predict an influence of a cumulative film adhering inside the processing container, on a temperature of the processing target substrate by using a simulation model of the heat treatment apparatus and an adjuster configured to adjust the power supplied to the heating part based on the predicted influence of the cumulative film adhering inside the processing container, on the temperature of the processing target substrate.

12 Claims, 16 Drawing Sheets

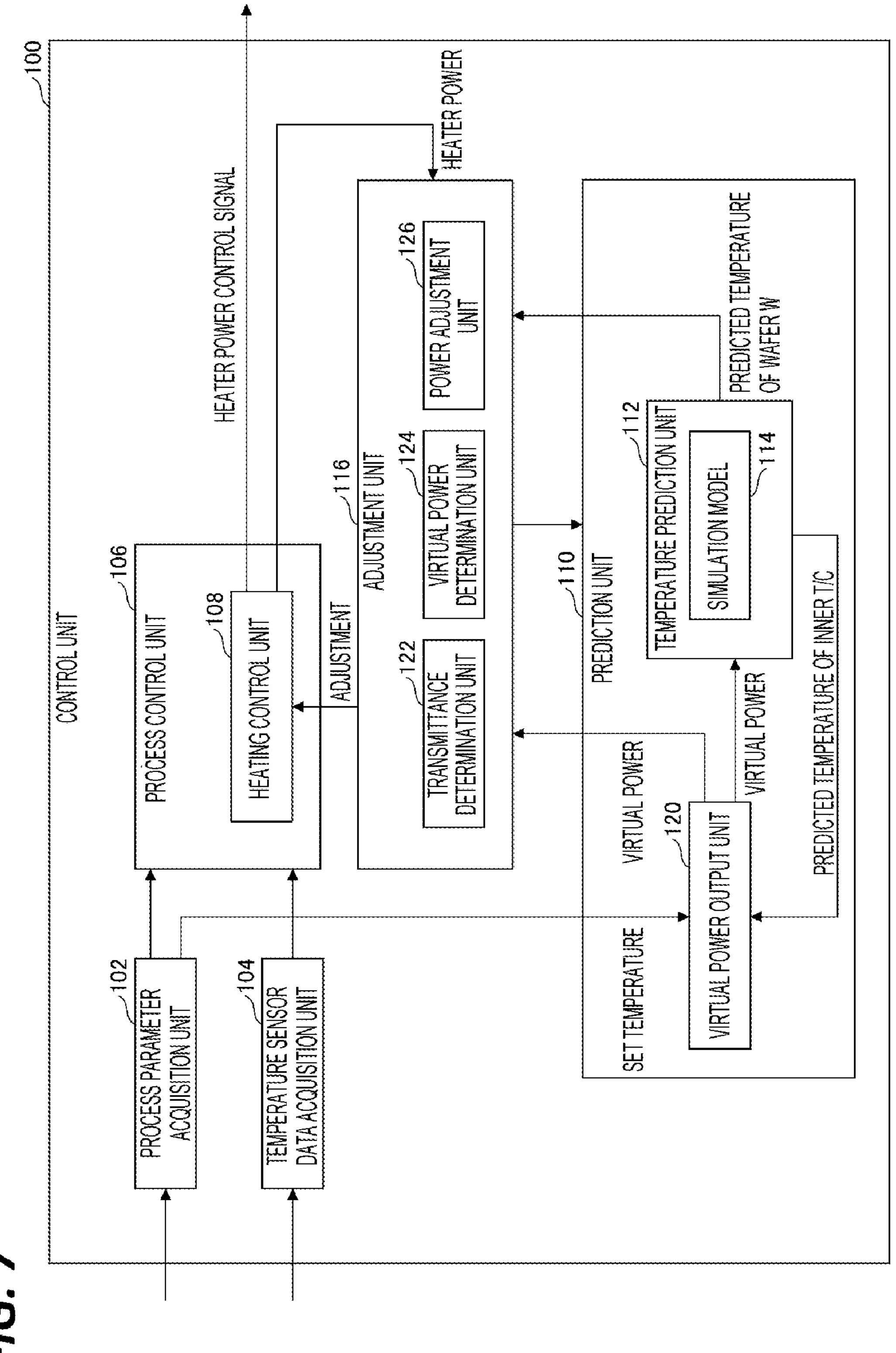
FIG. 7
100
CONTROL UNIT
102
PROCESS PARAMETER ACQUISITION UNIT
104
TEMPERATURE SENSOR DATA ACQUISITION UNIT
106
PROCESS CONTROL UNIT
108
HEATING CONTROL UNIT
HEATER POWER CONTROL SIGNAL
HEATER POWER
ADJUSTMENT
116
ADJUSTMENT UNIT
122
TRANSMITTANCE DETERMINATION UNIT
124
VIRTUAL POWER DETERMINATION UNIT
126
POWER ADJUSTMENT UNIT
110
PREDICTION UNIT
112
TEMPERATURE PREDICTION UNIT
114
SIMULATION MODEL
PREDICTED TEMPERATURE OF WAFER W
PREDICTED TEMPERATURE OF INNER T/C
VIRTUAL POWER
VIRTUAL POWER
120
VIRTUAL POWER OUTPUT UNIT
SET TEMPERATURE

FIG. 12

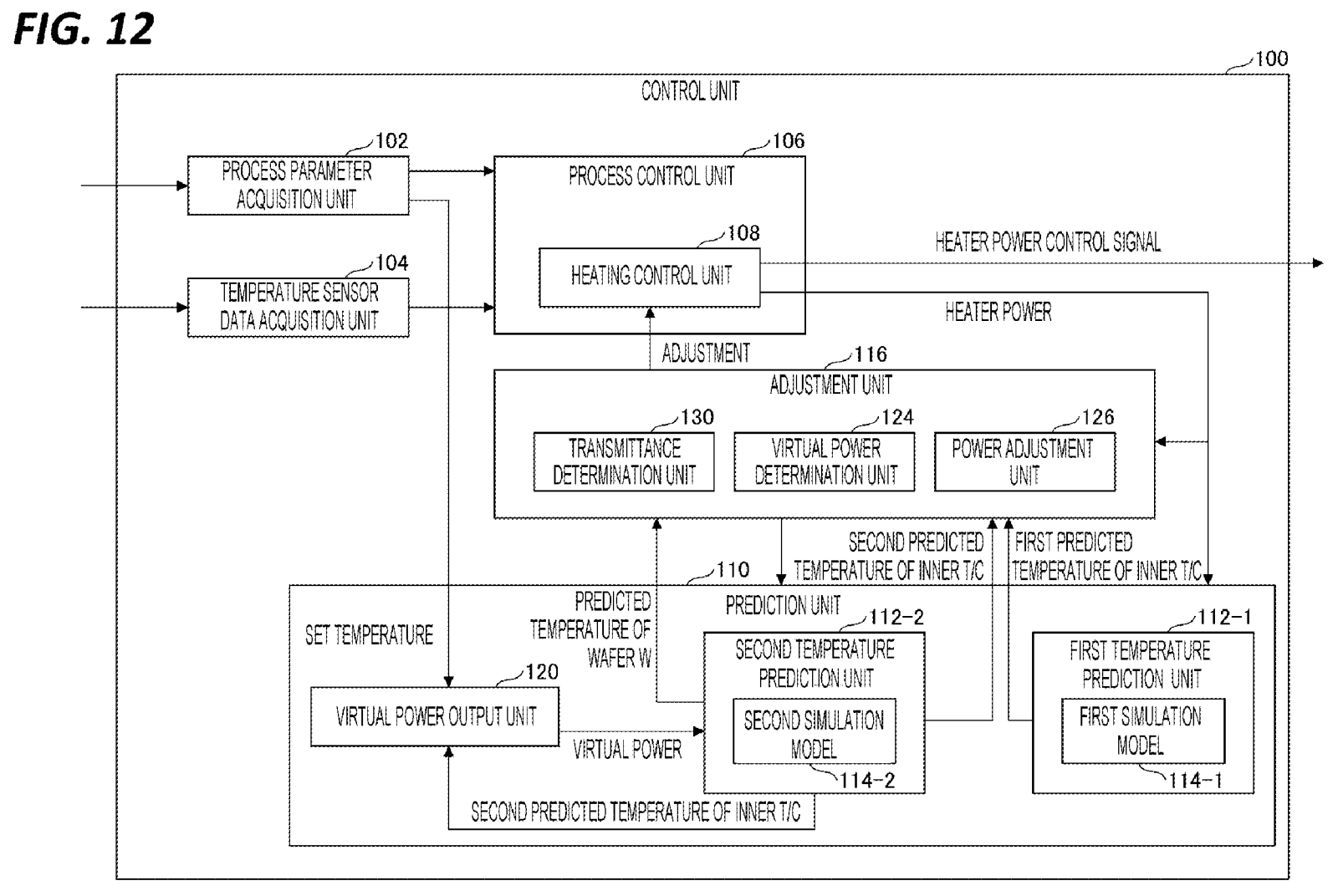

100
CONTROL UNIT
102
PROCESS PARAMETER ACQUISITION UNIT
104
TEMPERATURE SENSOR DATA ACQUISITION UNIT
106
PROCESS CONTROL UNIT
108
HEATING CONTROL UNIT
HEATER POWER CONTROL SIGNAL
HEATER POWER
ADJUSTMENT
116
ADJUSTMENT UNIT
130
TRANSMITTANCE DETERMINATION UNIT
124
VIRTUAL POWER DETERMINATION UNIT
126
POWER ADJUSTMENT UNIT
SECOND PREDICTED TEMPERATURE OF INNER T/C
FIRST PREDICTED TEMPERATURE OF INNER T/C
110
PREDICTION UNIT
SET TEMPERATURE
PREDICTED TEMPERATURE OF WAFER W
112-2
SECOND TEMPERATURE PREDICTION UNIT
SECOND SIMULATION MODEL
114-2
112-1
FIRST TEMPERATURE PREDICTION UNIT
FIRST SIMULATION MODEL
114-1
120
VIRTUAL POWER OUTPUT UNIT
VIRTUAL POWER
SECOND PREDICTED TEMPERATURE OF INNER T/C

250
ANALYSIS SERVER
210
AUTONOMOUS-CONTROL CONTROLLER
210
AUTONOMOUS-CONTROL CONTROLLER
220
DEVICE-CONTROL CONTROLLER
230
HOST COMPUTER
240
EXTERNAL METER
10
HEAT TREATMENT APPARATUS
10
HEAT TREATMENT APPARATUS

INFORMATION PROCESSING SYSTEM, POWER ADJUSTMENT METHOD, AND HEAT TREATMENT APPARATUS

CROSS-REFERENCE TO RELATED APPLICATIONS

The present application is based on and claims priority from Japanese Patent Application No. 2022-131130, filed on Aug. 19, 2022, with the Japan Patent Office, the disclosure of which is incorporated herein in its entirety by reference.

TECHNICAL FIELD

The present disclosure relates to an information processing system, a power adjustment method, and a heat treatment apparatus.

BACKGROUND

A heat treatment apparatus, for example, supplies a gas into a process tube accommodating wafers therein, and performs a predetermined heat treatment on the wafers by heating using a heater. In order to perform uniform heat treatment over the wafers inside the process tube, conventional heat treatment apparatuses have been equipped with temperature sensors at a plurality of predetermined locations inside the process tube and have controlled the heating using the heater based on measured temperatures.

There has been known a technique for visualizing process statuses such as the temperature status of a semiconductor manufacturing apparatus during the execution of a process by the semiconductor manufacturing apparatus (see, e.g., Japanese Patent Laid-Open Publication No. 2021-132140).

SUMMARY

According to an aspect of the present disclosure, an information processing system includes a heat treatment apparatus that forms a film on a processing target substrate by using a heating unit that heats the processing target substrate inside a processing container, and an information processing apparatus that controls power supplied to the heating unit, the information processing system including: a prediction unit that predicts an influence of a cumulative film adhering inside the processing container, on a temperature of the processing target substrate by using a simulation model of the heat treatment apparatus; and an adjustment that adjusts the power supplied to the heating unit based on the predicted influence of the cumulative film adhering inside the processing container, on the temperature of the processing target substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is a diagram illustrating an exemplary functional configuration of the control unit of the heat treatment apparatus according to the present embodiment.

FIG. 12 is a diagram illustrating an exemplary functional configuration of the control unit of the heat treatment apparatus according to the present embodiment.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings.

Figure 1:
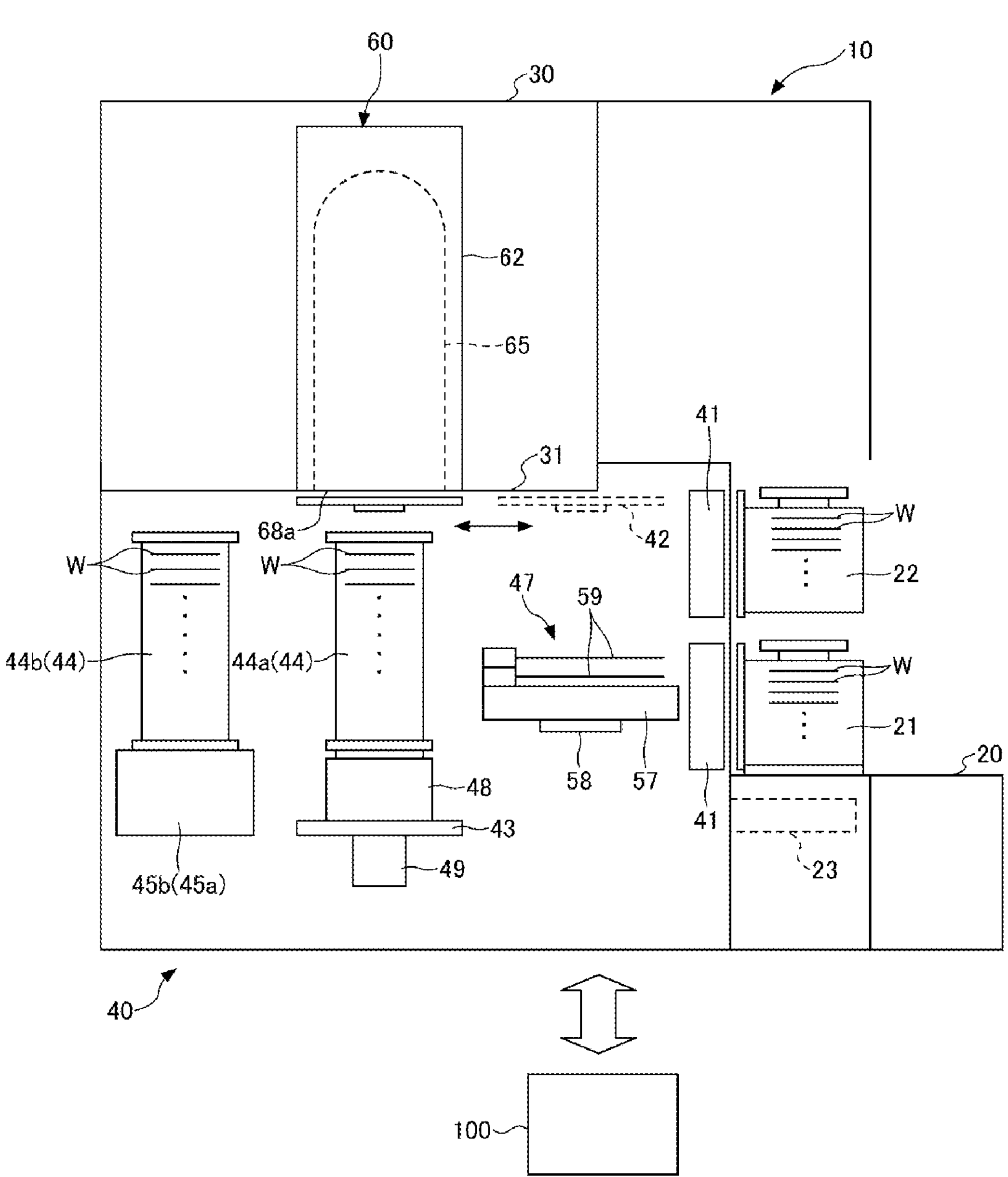
FIG. 1 is a longitudinal cross-sectional view schematically illustrating a heat treatment apparatus according to the present embodiment.

FIG. 1 is a longitudinal cross-sectional view schematically illustrating a heat treatment apparatus according to the present embodiment. The heat treatment apparatus 10 includes a vertical type heat treatment furnace 60, and holds and accommodates wafers W at predetermined intervals in the vertical direction within a boat, thereby performing various heat treatment processes such as oxidation, diffusion, and low-pressure CVD on the wafers W. In the following, descriptions will be made on an example of performing heat treatment on surfaces of the wafers W provided in a processing container 65 by supplying a gas into the processing container 65. The wafer W is an example of a processing target substrate. The processing target substrate is not limited to the circular wafer W.

The heat treatment apparatus 10 of FIG. 1 includes a stage (load port) 20, a housing 30, and a control unit 100. The stage (load port) 20 is provided in a front portion of the housing 30. The housing 30 includes a loading area (working area) 40 and the heat treatment furnace 60.

The loading area 40 is provided at the lower side inside the housing 30. The heat treatment furnace 60 is provided above the loading area 40 inside the housing 30. Further, a base plate 31 is provided between the loading area 40 and the heat treatment furnace 60.

The stage (load port) 20 is configured to load and unload the wafers W into and from the housing 30. Storage containers 21 and 22 are disposed on the stage (load port) 20. Each of the storage containers 21 and 22 is a sealed storage container (hoop) having a detachable lid (not illustrated) on the front side thereof and is capable of accommodating a plurality of (e.g., about 25) wafers W at predetermined intervals.

Further, an alignment device (aligner) 23 may be provided below the stage 20 to align, in one direction, cutouts (e.g., notches) provided on the outer periphery of the wafers W transferred by a transfer mechanism 47.

The loading area (working area) 40 is configured to transfer the wafers W between the storage containers 21 and 22 and a boat 44 to load the boat 44 into the processing container 65 and unload the boat 44 from the processing container 65. In the loading area 40, a door mechanism 41, a shutter mechanism 42, a lid body 43, the boat 44, a base 45*a*, a base 45*b*, a lift mechanism 46 (see FIG. 2), and the transfer mechanism 47 are provided.

The door mechanism 41 is configured to remove the lids of the storage containers 21 and 22 and open the storage containers 21 and 22 to the loading area 40. The shutter mechanism 42 is provided at the upper side of the loading area 40. The shutter mechanism 42 is provided to cover (or close) a furnace opening 68*a* in order to reduce or prevent high-temperature heat inside the furnace from being released from the furnace opening 68*a* to the loading area 40 when the lid body 43 is open.

The lid body 43 includes a thermal insulation cylinder 48 and a rotation mechanism 49. The thermal insulation cylinder 48 is disposed on the lid body 43. The thermal insulation cylinder 48 is used to prevent the boat 44 from being cooled by heat transfer with the lid body 43 side and keep the boat 44 warm. The rotation mechanism 49 is attached to the bottom of the lid body 43. The rotation mechanism 49 is configured to rotate the boat 44. A rotating shaft of the rotation mechanism 49 is provided so as to pass through the lid body 43 airtightly and rotate a rotary table disposed on the lid body 43.

The lift mechanism 46 drives the lid body 43 so as to move up and down when loading and unloading the boat 44 between the loading area 40 and the processing container 65. Then, the lid body 43 is provided so as to come into contact with the furnace opening 68*a* and seal the furnace opening 68*a* when the lid body 43 moved up by the lift mechanism 46 is loaded into the processing container 65.

The boat 44 disposed on the lid body 43 may rotatably hold the wafers W in a horizontal plane inside the processing container 65. The heat treatment apparatus 10 may include a plurality of boats 44. In the loading area 40, boats 44*a* and 44*b* are provided.

In the loading area 40, the base 45*a*, the base 45*b*, and a boat transfer mechanism are provided. The bases 45*a* and 45*b* are stages onto which the boats 44*a* and 44*b* are transferred from the lid body 43, respectively. The boat transfer mechanism is configured to transfer the boat 44*a* or 44*b* from the lid body 43 to the base 45*a* or 45*b*.

The boats 44*a* and 44*b* are made of, for example, quartz, and are configured to mount the wafers W having a large diameter such as a diameter of 300 mm in a horizontal state at predetermined intervals (pitch width) in the vertical direction. The boats 44*a* and 44*b* are provided with a plurality of (e.g., three) pillars between a top plate and a bottom plate. The pillars are provided with hooks for holding the wafers W. Further, the boats 44*a* and 44*b* may be appropriately provided with auxiliary columns together with the pillars.

The transfer mechanism 47 is configured to transfer the wafers W between the storage container 21 or 22 and the boat 44*a* or 44*b*. The transfer mechanism 47 includes a base 57, a lift arm 58, and a plurality of forks (transfer plates) 59. The base 57 is installed to be movable up and down and pivotable. The lift arm 58 is installed to be movable (liftable) in the vertical direction by ball screws, or others. The base 57 is installed to the elevating arm 58 so as to be horizontally pivotable.

Figure 2:
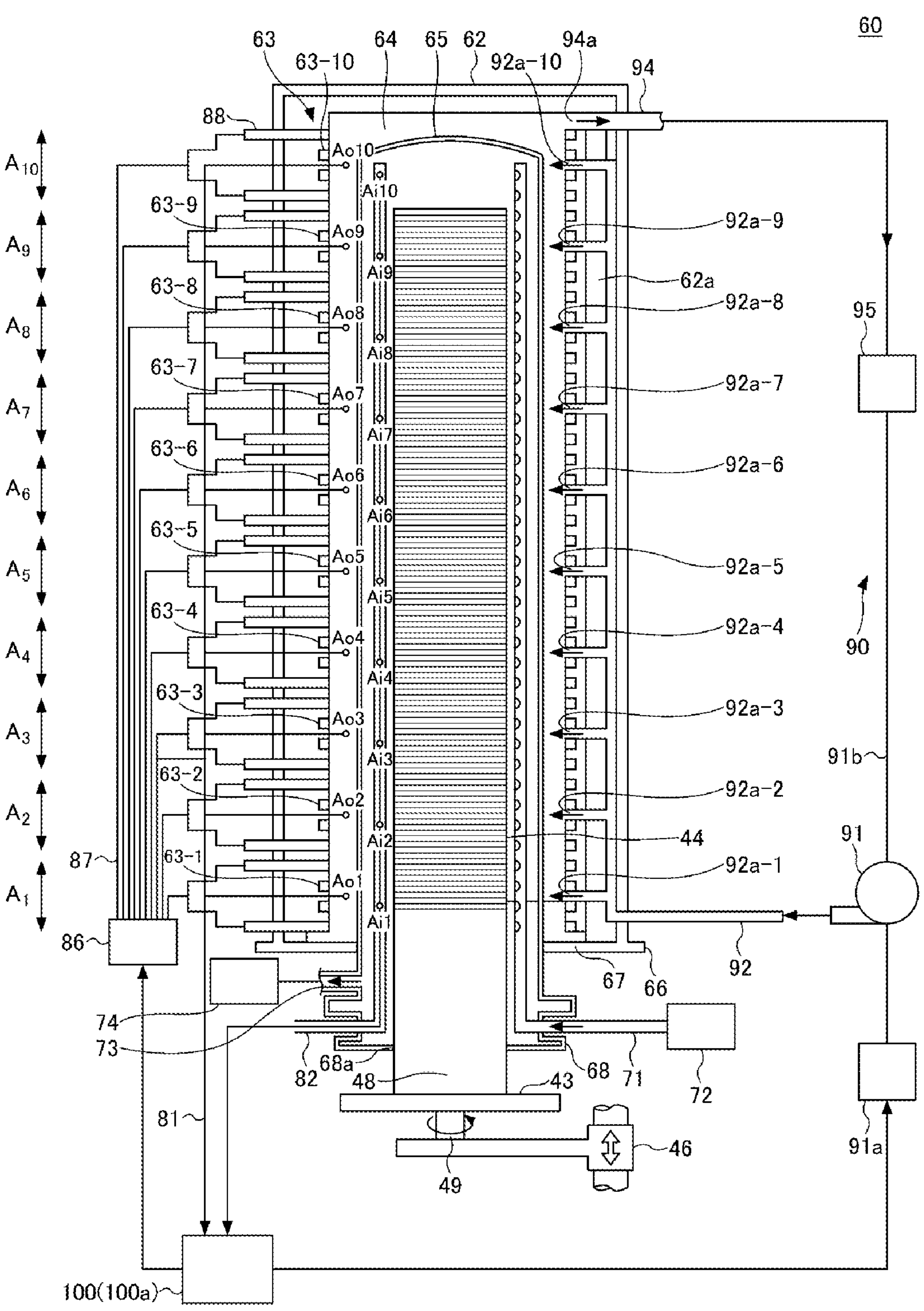
FIG. 2 is a cross-sectional view illustrating a schematic configuration of a heat treatment furnace.

FIG. 2 is a cross-sectional view illustrating a schematic configuration of the heat treatment furnace. The heat treatment furnace 60 in FIG. 2 is an example of a vertical-type furnace for accommodating a plurality of thin disk-shaped wafers W to perform predetermined heat treatment thereon. The heat treatment furnace 60 includes a jacket 62, a heater 63, a space 64, and the processing container 65.

The processing container 65 is configured to accommodate the wafers W held in the boat 44, which are then subjected to heat treatment therein. The processing container 65 is made of, for example, quartz, and has a vertically long shape. The processing container 65 is supported by a base plate 66 via a manifold 68 at the bottom thereof. A gas is supplied from the manifold 68 to the processing container 65 via an injector 71. The injector 71 supplies the gas into the processing container 65 from a blowing portion (hole) thereof. The injector 71 is connected to a gas source 72. Further, the gas supplied to the processing container 65 is discharged through an exhaust port 73 from an exhaust system 74, which is equipped with an evacuation controllable vacuum pump.

The lid body 43 closes the furnace opening 68*a* at the bottom of the manifold 68 when the boat 44 is loaded into the processing container 65. The lid body 43 is installed to be movable up and down by the lift mechanism 46. The thermal insulation cylinder 48 is disposed on the top of the lid body 43. The boat 44 in which a plurality of wafers W are mounted at predetermined intervals in the vertical direction is disposed on the top of the thermal insulation cylinder 48.

The jacket 62 is provided to cover the periphery of the processing container 65 and defines the space 64 around the processing container 65. The jacket 62 has a cylindrical shape similarly to the processing container 65. The jacket 62 is supported by the base plate 66. A heat insulator 62*a* made of, for example, glass wool may be provided inside the jacket 62 and outside the space 64.

The heater 63 is provided to cover the periphery of the processing container 65. For example, the heater 63 is provided inside the jacket 62 and outside the space 64. The heater 63 heats the processing container 65, and also heats the wafers W held in the boat 44, i.e., the wafers W inside the processing container 65. The heater 63 functions as a heating unit that heats the wafers W.

Further, the heater 63 includes, for example, a heating resistor such as a carbon wire. The heater 63 may control the temperature of the gas flowing through the space 64, and may control the heating of the inside of the processing container 65 to a predetermined temperature (e.g., 50° C. to 1,200° C.).

The space 64 and the space inside the processing container 65 are divided into a plurality of unit areas, for example, 10 unit areas $A_1$, $A_2$, $A_3$, $A_4$, $A_5$, $A_6$, $A_7$, $A_8$, $A_9$ and $A_{10}$ in the vertical direction. The heater 63 is divided into heaters 63-1, 63-2, 63-3, 63-4, 63-5, 63-6, 63-7, 63-8, 63-9, and 63-10 so as to correspond to each of the unit areas in the vertical direction, respectively. Each of the heaters 63-1 to 63-10 is configured to be able to independently control heating corresponding to each of the unit areas $A_1$ to $A_{10}$ by the output power (heater power) of a heater output unit 86, which includes, for example, a thyristor. The heaters 63-1 to 63-10 are an example of heating elements.

FIG. 2 illustrates an example in which the space 64 and the space inside the processing container 65 are divided into 10 unit areas in the vertical direction. The number of divided unit areas is not limited to 10, and the space 64 and the space inside the processing container 65 may be divided by any number other than 10. Further, FIG. 2 illustrates uniform division, but the present disclosure is not limited thereto, and the space in the vicinity of the furnace opening 68*a* where a temperature change is large may be divided into fine areas. The heaters 63-1 to 63-10 may be provided at different positions in the vertical direction, respectively, and may not be provided in a one-to-one correspondence with each of the unit areas $A_1$ to $A_{10}$.

In the space 64, heater temperature sensors Ao1 to Ao10 for measuring temperatures corresponding to each of the unit areas $A_1$ to $A_{10}$ are provided as outer T/Cs. Further, in the space inside the processing container 65, processing container internal temperature sensors Ai1 to Ai10 for measuring temperatures corresponding to each of the unit areas $A_1$ to $A_{10}$ are provided as inner T/Cs. The heater temperature sensors Ao1 to Ao10 and the processing container internal temperature sensors Ai1 to Ai10 measure the temperatures in order to measure the temperature distribution in the vertical direction. The temperatures measured by the processing container internal temperature sensors Ai1 to Ai10 are an example of measured temperatures inside the processing container 65.

Measurement signals from the heater temperature sensors Ao1 to Ao10 are input to the control unit 100 via lines 81, respectively. Measurement signals from the processing container internal temperature sensors Ai1 to Ai10 are input to the control unit 100 via lines 82, respectively. The control unit 100 to which the measurement signals are input controls heater power supplied from the heater output unit 86 to the heaters 63-1 to 63-10 based on a set temperature to be described later. The heater output unit 86 supplies the heater power to each of the heaters 63-1 to 63-10 via heater output lines 87 and heater terminals 88 under the control of the control unit 100.

Further, the heat treatment furnace 60 may include a cooling mechanism 90 for cooling the processing container 65. The cooling mechanism 90 includes, for example, a blower 91, a blowing pipe 92, and an exhaust pipe 94.

The blower 91 cools the processing container 65, for example, by blowing a cooling gas containing air into the space 64 where the heater 63 is provided. The blowing pipe 92 sends the cooling gas from the blower 91 to the heater 63. The blowing pipe 92 is connected to each of ejection holes 92*a*-1 to 92*a*-10, and supplies the cooling gas to the space 64.

The exhaust pipe 94 is configured to discharge the air inside the space 64. The space 64 is provided with an exhaust port 94*a* for discharging the cooling gas from the space 64. The exhaust pipe 94 has one end connected to the exhaust port 94*a*.

Further, as illustrated in FIG. 2, the heat treatment furnace 60 may be provided with a heat exchanger 95 in the middle of the exhaust pipe 94, and the other end of the exhaust pipe 94 may be connected to the suction side of the blower 91. Then, the cooling gas discharged through the exhaust pipe 94 may be heat-exchanged with the heat exchanger 95 without being discharged to a factory exhaust system, and then, may be returned to the blower 91 for recirculation. Further, in that case, it may be circulated through an air filter (not illustrated). Alternatively, the cooling gas discharged from the space 64 may be discharged from the exhaust pipe 94 to the factory exhaust system by way of the heat exchanger 95.

The blower 91 may be configured to control the air volume of the blower 91 by controlling the power supplied from a power supply 91*a* including an inverter, for example, in response to an output signal from the control unit 100.

The control unit 100 is implemented by, for example, a computer 500 to be described later. The control unit 100 reads a program recorded in a storage device and sends a control signal to each part constituting the heat treatment apparatus 10 according to the program to perform heat treatment. For example, the control unit 100 adjusts the temperature inside the processing container 65 by controlling the heater power supplied from the heater output unit 86 to the heater 63.

Figure 3A:
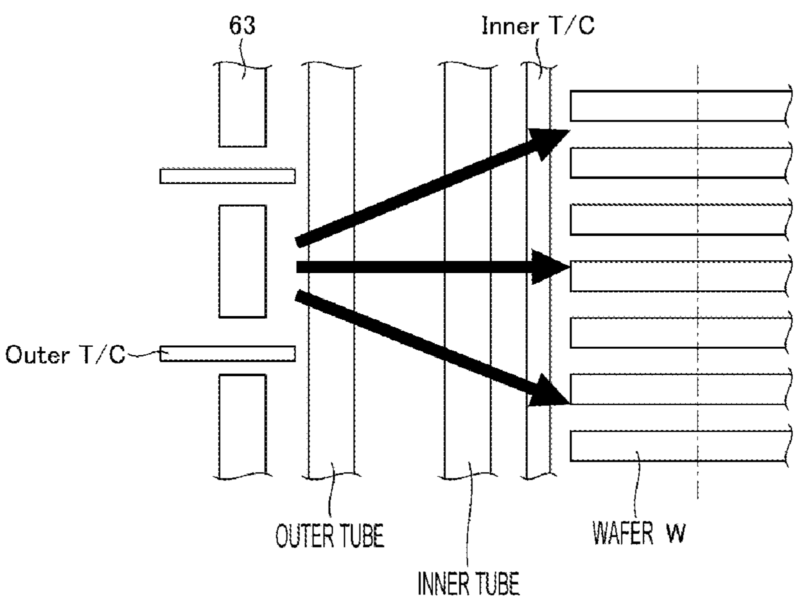
FIGS. 3A and 3B are exemplary diagrams illustrating the influence of a cumulative film adhering inside a processing container.
Figure 3B:
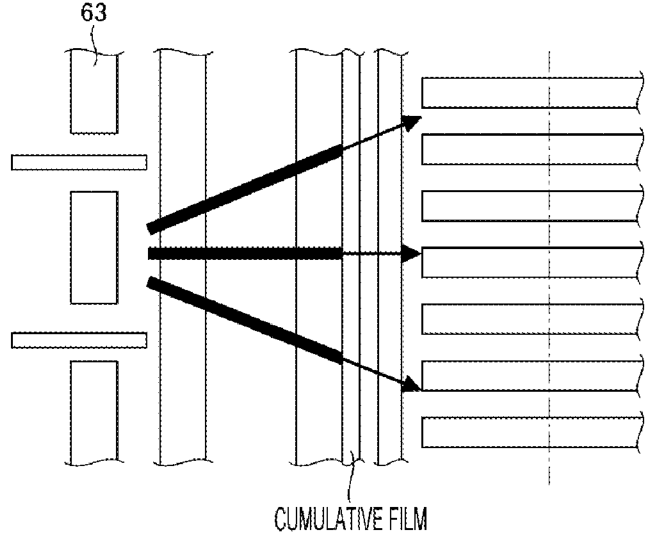

In the heat treatment apparatus 10 illustrated in FIGS. 1 and 2, the influence of a cumulative film adhering inside the processing container 65 is as follows. FIGS. 3A and 3B are exemplary diagrams illustrating the influence of a cumulative film adhering inside the processing container. In FIGS. 3A and 3B, the processing container 65 is illustrated as being divided into an inner tube and an outer tube. In the following, the processing container 65 may be referred to as a tube. For example, when thermally processing the wafer W, the inside of the tube becomes a vacuum.

FIG. 3A is an image diagram illustrating an example heat exchange when there is no cumulative film adhering inside the tube. Since the inside of the tube is under vacuum, the wafer W is heated by radiant heat. A tube made of quartz allows radiant heat to pass therethrough as it is unless a cumulative film adheres thereto. When there is no cumulative film adhering inside the tube, the loss of heat is small and the heat from the heater 63 reaches the wafer W as it is.

FIG. 3B is an image diagram illustrating an example heat exchange when there is a cumulative film adhering inside the tube. A cumulative film of silicon (Si) is silver in color and has a high reflectance. Therefore, a tube with the cumulative film adhering thereto does not transfer the same heat as that in a tube without the cumulative film adhering thereto from the heater 63 to the wafer W unless the heater power supplied to the heater 63 is increased in the tube with the cumulative film adhering thereto than in the tube without the cumulative film adhering thereto.

Figure 4:
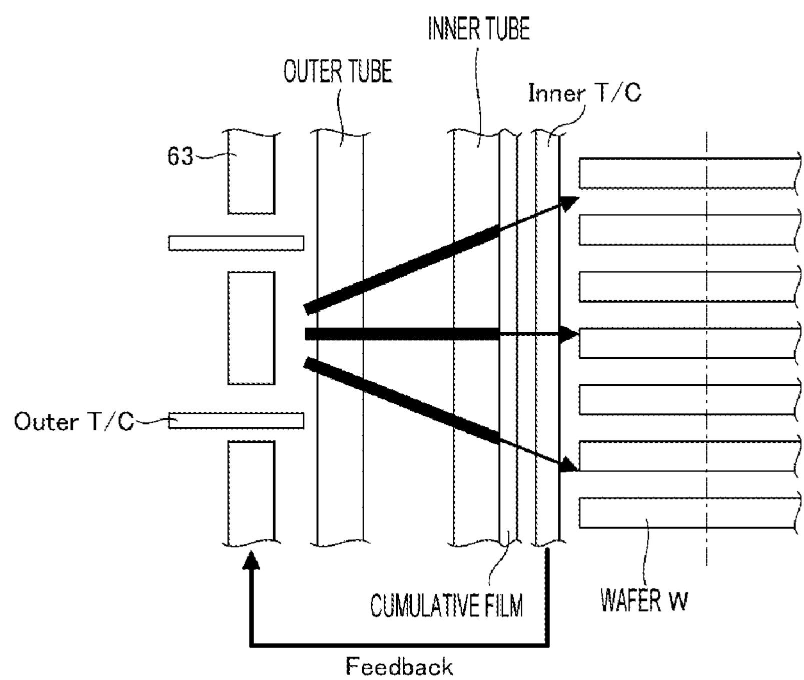
FIG. 4 is an exemplary diagram illustrating a processing of reducing the influence of a cumulative film adhering inside a tube.

In the existing heat treatment apparatus 10, the influence of the cumulative film adhering inside the tube has been reduced, as illustrated in, for example, FIG. 4. FIG. 4 is an exemplary diagram illustrating a processing of reducing the influence of the cumulative film adhering inside the tube.

FIG. 4 illustrates an image of reducing the influence of the cumulative film adhering inside the tube by feedback controlling the heater power supplied to the heater 63 based on a measured temperature of the inner T/C.

As illustrated in FIG. 4, the existing heat treatment apparatus 10 reduces the influence of the cumulative film adhering inside the tube by raising the heater power based on the measured temperature of the inner T/C, which is lowered due to the influence of the cumulative film adhering inside the tube.

However, as illustrated in FIG. 4, the location where the inner T/C measures the temperature is closer to the heater 63 than the location where the wafer W is stored. Thus, the example of FIG. 4 is intended to reduce the influence of the cumulative film on heat that reaches the location where the inner T/C measures the temperature from the heater 63, and is not intended to reduce the influence of the cumulative film on heat that reaches the wafer W from the heater 63. Further, since the cumulative film also adheres to a surface of the inner T/C, the accuracy of the inner T/C itself also deteriorates due to the adherence of the cumulative film.

Therefore, the heat treatment apparatus 10 according to the present embodiment uses a simulation model of the heat treatment apparatus 10 in a state where no cumulative film adheres inside the tube, as described later, to predict the influence of the cumulative film on the heat that reaches the wafer W from the heater 63, and reduce the influence of the cumulative film on the heat that reaches the wafer W from the heater 63.

Figure 5:
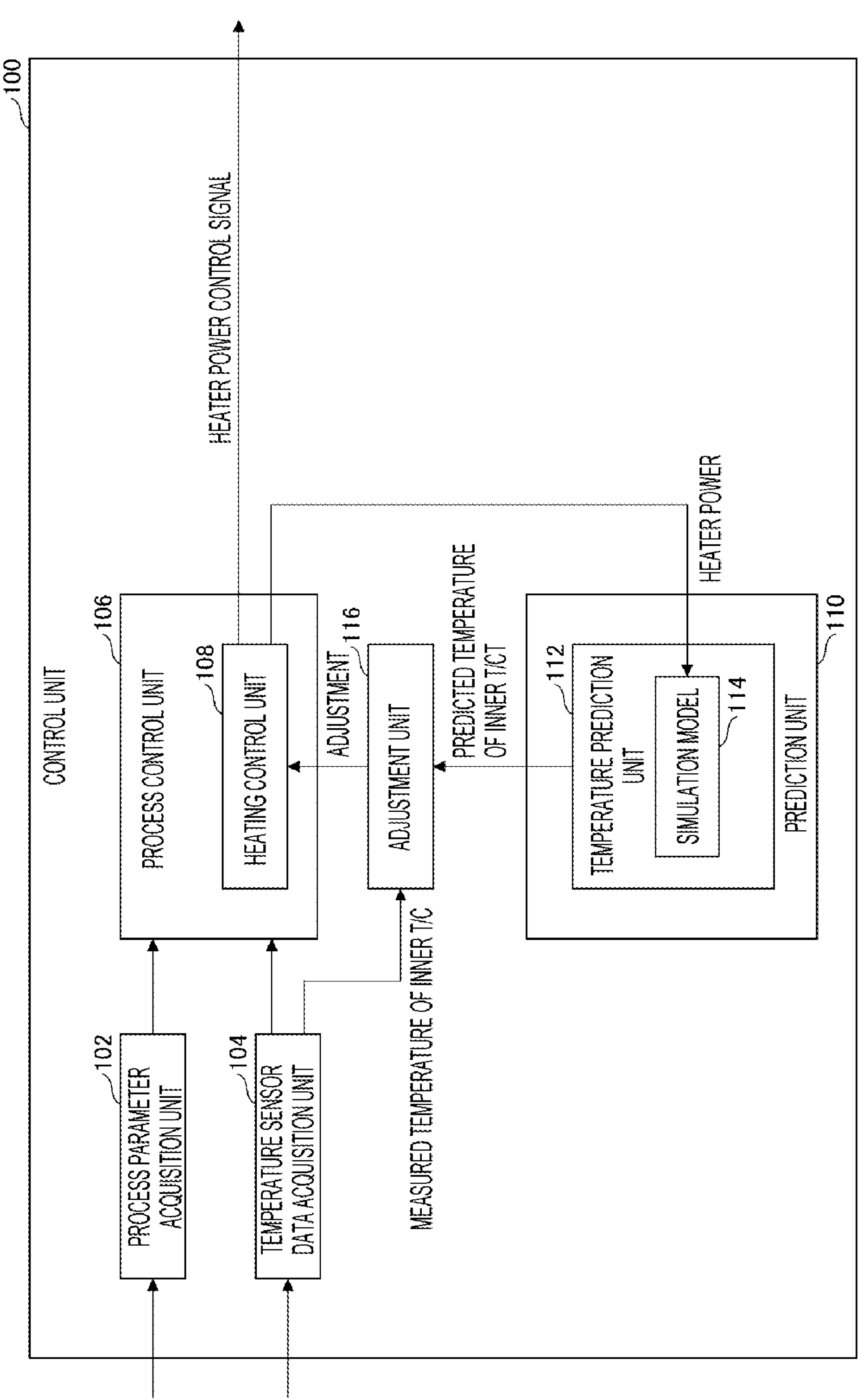
FIG. 5 is a diagram illustrating an exemplary functional configuration of a control unit of the heat treatment apparatus according to the present embodiment.

The control unit 100 of the heat treatment apparatus 10 is implemented by a functional configuration illustrated in, for example, FIG. 5. FIG. 5 is a diagram illustrating an exemplary functional configuration of the control unit of the heat treatment apparatus according to the present embodiment. In the functional block diagram of FIG. 5, illustration of components unnecessary for the description of the present embodiment is omitted.

The control unit 100 implements a process parameter acquisition unit 102, a temperature sensor data acquisition unit 104, a process control unit 106, a heating control unit 108, a prediction unit 110, a temperature prediction unit 112, a simulation model 114, and an adjustment unit 116 by executing a program.

The process parameter acquisition unit 102 acquires process parameters of a process executed by the heat treatment apparatus 10. The process parameter acquisition unit 102 provides the acquired process parameters to the process control unit 106. The process parameters include a set temperature inside the processing container 65.

The temperature sensor data acquisition unit 104 acquires the measured temperature of the inner T/C. The temperature sensor data acquisition unit 104 provides the acquired measured temperature of the inner T/C to the process control unit 106 and the adjustment unit 116.

The process control unit 106 executes a process in the heat treatment apparatus 10 based on the process parameters provided from the process parameter acquisition unit 102. The process control unit 106 includes a temperature control unit. The temperature control unit determines the heater power based on the provided measured temperature and set temperature inside the processing container 65. The heating control unit 108 provides a heater power control signal to the heater output unit 86, thereby controlling the supply of the heater power from the heater output unit 86 to the heater 63.

Further, the heating control unit 108 notifies the temperature prediction unit 112 of the prediction unit 110 of the heater power determined by the temperature control unit. The temperature prediction unit 112 includes the simulation model 114 of the heat treatment apparatus 10. The simulation model 114 of the heat treatment apparatus 10 is a physical model that reproduces the configuration of FIG. 2. The simulation model 114 is a thermal model that outputs the predicted temperature of the inner T/C inside the processing container 65 based on the heater power determined by the temperature control unit and may use a thermal model built by integrating a plurality of simulation methods such as 1DCAE or 3DCAE (fluid simulation). The simulation model 114 undergoes modeling of a heat exchange relationship, specific heat, and others.

By creating 1DCAE or 3DCAE physical models that incorporate a configuration of the heater 63, a reactor configuration of the heater 63, and a configuration of the surroundings of the heater 63, the simulation model 114 may predict and output the temperature of the inner T/C inside the processing container 65, which is an example of output data, based on the heater power supplied to the heater 63, which is an example of input data.

As such, the simulation model 114 of the present embodiment may predict the temperature measured by the inner T/C inside the processing container 65 and output it as a predicted temperature based on the input of required information such as the heater power.

The temperature prediction unit 112 uses the simulation model 114 of the heat treatment apparatus 10 to output the predicted temperature of the inner T/C inside the processing container 65, based on the heater power supplied to the heater 63 of the heat treatment apparatus 10, to the adjuster 116.

The adjuster 116 determines a heater power difference from Table 1, for example, based on a difference between the measured temperature of the inner T/C provided from the temperature sensor data acquisition unit 104 and the predicted temperature of the inner T/C inside the processing container 65 provided from the temperature prediction unit 112.

TABLE 1

| Temperature zone | Difference between predicted temperature of inner T/C and measured temperature | Heater power difference | Film thickness amount of cumulative film (nm) | Transmittance | ~ |
|---|---|---|---|---|---|
| 0-100 | 0 | 0 | 0 | 1 | ~ |
| 0-100 | 0.5 | 20 | 230 | 0.84 | ~ |
| 0-100 | 1 | 40 | 450 | 0.61 | ~ |
| 0-100 | 1.5 | 60 | 620 | 0.52 | ~ |
| 0-100 | 2 | 120 | 850 | 0.47 | ~ |
| 0-100 | 2.5 | 180 | 1060 | 0.39 | ~ |
| 100-200 | 0 | 0 | 0 | 1 | ~ |
| 100-200 | 0.5 | 20 | 240 | 0.85 | ~ |
| 100-200 | 1 | 40 | 460 | 0.63 | ~ |
| 100-200 | 1.5 | 60 | 610 | 0.5 | ~ |
| 100-200 | 2 | 120 | 830 | 0.46 | ~ |
| 100-200 | 2.5 | 180 | 1050 | 0.38 | ~ |
| ~ | ~ | ~ | ~ | ~ | ~ |

For example, Table 1 may be set for each unit area. Further, in Table 1, since the transmittance of the cumulative film changes for each temperature zone, the difference between the predicted temperature and the measured temperature of the inner T/C is associated with the heater power difference for each temperature zone.

The item "Difference between predicted temperature and measured temperature of inner T/C" in Table 1 is a difference between the measured temperature of the inner T/C provided from the temperature sensor data acquisition unit 104 and the predicted temperature of the inner T/C inside the processing container 65 provided from the temperature prediction unit 112. Further, the item "Heater power difference" in Table 1 is a difference between the heater power supplied to the heater 63 of the heat treatment apparatus 10 and the heater power required to reduce the influence of the cumulative film adhering inside the processing container 65. The difference from the heater power required to reduce the influence of the cumulative film adhering inside the processing container 65 is an example of information required to adjust the heater power for bringing the temperature of the wafer W closer to a set temperature. The items "Film thickness amount of cumulative film" and "Transmittance" in Table 1 may be obtained from experiments and physical transmission calculation formulas, and are used for screen display, logs, and others. Table 1 visualizes calculations in an easy-to-understand manner, and approximation formulas or physical equations, which output answers equivalent to those in Table 1, may be used instead.

The adjuster 116 adjusts the heater power supplied from the heater output unit 86 to the heater 63 based on the determined heater power difference, thereby reducing the influence of the cumulative film adhering inside the processing container 65. The adjuster 116 acquires the film thickness amount of the cumulative film corresponding to the difference between the measured temperature of the inner T/C and the predicted temperature of the inner T/C from Table 1, and may adjust the heater power determined by the temperature control unit so as to reduce the influence of the acquired film thickness amount of the cumulative film.

Figure 6:
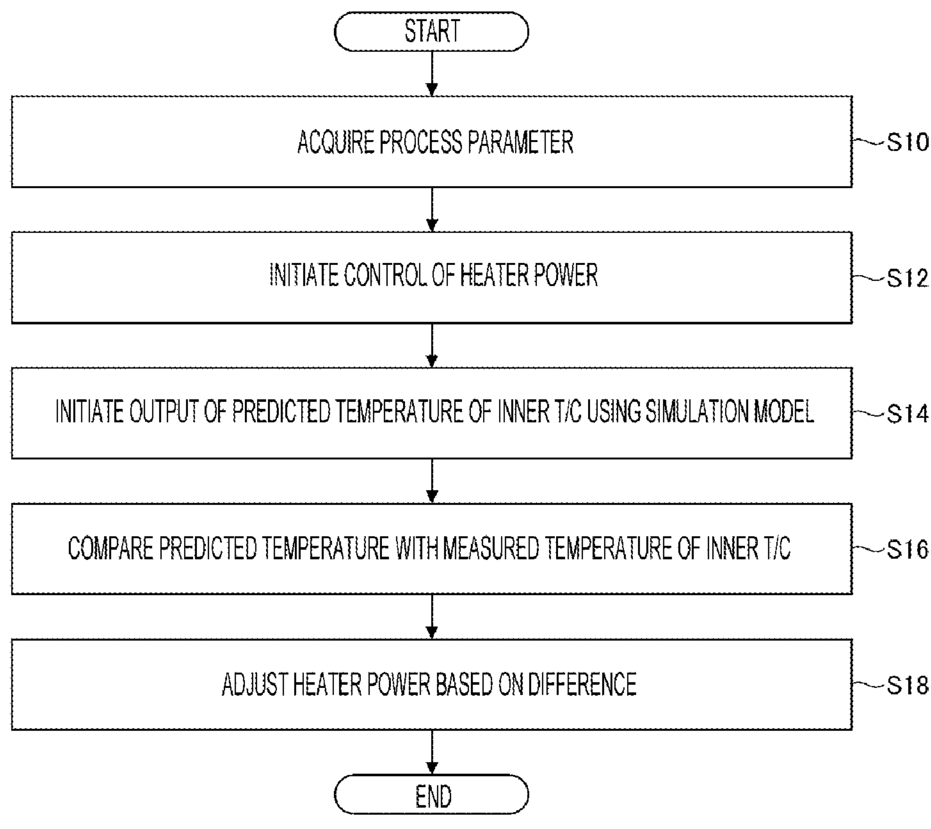
FIG. 6 is a flowchart illustrating an exemplary processing procedure of the control unit according to the present embodiment.

FIG. 6 is a flowchart of an exemplary processing procedure of the control unit according to the present embodiment. In step S10, the control unit 100 of the heat treatment apparatus 10 acquires process parameters of a process executed by the heat treatment apparatus 10.

In step S12, the process control unit 106 of the control unit 100 executes the process with the heat treatment apparatus 10 based on the acquired process parameters, and initiates the control of heater power supplied to the heater 63. This leads to the adjustment of the temperature inside the processing container 65 based on a set temperature.

In step S14, the prediction unit 110 of the control unit 100 uses the simulation model 114 to initiate the output of the predicted temperature of the inner T/C inside the processing container 65 based on the heater power supplied to the heater 63 of the heat treatment apparatus 10.

In step S16, the adjuster 116 of the control unit 100 compares the measured temperature of the inner T/C provided from the temperature sensor data acquisition unit 104 with the predicted temperature of the inner T/C inside the processing container 65 provided from the temperature prediction unit 112 to calculate the difference between the measured temperature and the predicted temperature of the inner T/C.

In step S18, the adjuster 116 adjusts the heater power supplied from the heater output unit 86 to the heater 63 based on the difference between the predicted temperature and the measured temperature of the inner T/C, thereby reducing the influence of the cumulative film adhering inside the processing container 65.

In this way, in the heat treatment apparatus 10 having the functional configuration of FIG. 5, the influence of the cumulative film adhering inside the tube may be obtained by comparing the predicted temperature of the inner T/C in a state where no cumulative film is adhering and the measured temperature of the inner T/C of the heat treatment apparatus 10, so that the heater power may be adjusted to reduce the influence of the cumulative film.

The control unit 100 of the heat treatment apparatus 10 may be implemented by a functional configuration illustrated in, for example, FIG. 7. FIG. 7 is a diagram illustrating an exemplary functional configuration of the control unit of the heat treatment apparatus according to the present embodiment. In the functional block diagram of FIG. 7, illustration of components unnecessary for the description of the present embodiment is omitted.

The control unit 100 implements the process parameter acquisition unit 102, the temperature sensor data acquisition unit 104, the process control unit 106, the heating control unit 108, the prediction unit 110, and the adjustment unit 116 by executing a program. The prediction unit 110 includes the temperature prediction unit 112, the simulation model 114, and a virtual power output unit 120. Further, the adjustment unit 116 includes a transmittance determiner 122, a virtual power determiner 124, and a power adjustment unit 126.

The process parameter acquisition unit 102 acquires process parameters of a process executed by the heat treatment apparatus 10. The process parameter acquisition unit 102 provides the acquired process parameters to the process control unit 106. The process parameters include the set temperature inside the processing container 65. Further, the process parameter acquisition unit 102 provides the set temperature inside the processing container 65 to the virtual power output unit 120.

The temperature sensor data acquisition unit 104 acquires the measured temperature of the inner T/C. The temperature sensor data acquisition unit 104 provides the acquired measured temperature of the inner T/C to the process control unit 106.

The process control unit 106 executes a process in the heat treatment apparatus 10 based on the process parameters provided from the process parameter acquisition unit 102. The process control unit 106 includes a temperature control unit. The temperature control unit determines the heater power based on the provided measured temperature and set temperature inside the processing container 65. The heating control unit 108 provides a heater power control signal to the heater output unit 86, thereby controlling the supply of the heater power from the heater output unit 86 to the heater 63.

The virtual power output unit 120 includes the same type temperature control unit (hereinafter referred to as a virtual temperature control unit) as in the process control unit 106. The virtual temperature control unit of the virtual power output unit 120 calculates the heater power supplied to the heater 63 (hereinafter referred to as virtual power) based on the set temperature inside the processing container 65, provided from the process parameter acquisition unit 102, and the predicted temperature of the inner T/C provided from the temperature prediction unit 112. The virtual power output unit 120 provides the calculated virtual power to the temperature prediction unit 112. Further, the virtual power output unit 120 provides the calculated virtual power to the adjustment unit 116.

The temperature prediction unit 112 includes the simulation model 114 of the heat treatment apparatus 10. The simulation model 114 of the heat treatment apparatus 10 is a physical model, and is a thermal model that outputs the predicted temperature inside the processing container 65 based on the virtual power and the transmittance of the cumulative film. The simulation model 114 may use, for example, a 1DCAE simulation model. The simulation model 114 undergoes modeling of a heat exchange relationship, specific heat, and others.

By creating 1DCAE or 3DCAE physical models that incorporate a configuration of the heater 63, a reactor configuration of the heater 63, and a configuration of the surroundings of the heater 63, the simulation model 114 may predict and output the temperature of the inner T/C inside the processing container 65 and the temperature of the wafer W, which are examples of output data, based on the heater power supplied to the heater 63, which is example of input data.

The simulation model 114 of FIG. 7 may output the predicted temperature of the inner T/C inside the processing container 65 and a predicted temperature of the wafer W in response to the input of the virtual power. The temperature prediction unit 112 uses the simulation model 114 of the heat treatment apparatus 10 to predict the temperature of the inner T/C inside the processing container 65 based on the virtual power, and outputs (feed backs) the predicted temperature of the inner T/C to the virtual power output unit 120. Further, the temperature prediction unit 112 predicts the temperature of the wafer W inside the processing container 65 based on the virtual power, and outputs the predicted temperature of the wafer W to the adjustment unit 116.

Further, the heating control unit 108 notifies the adjuster 116 of the heater power determined by the temperature control unit. The transmittance determiner 122 of the adjuster 116 compares the heater power notified from the heating control unit 108 with the virtual power provided from the virtual power output unit 120 to calculate the heater power difference. The transmittance determiner 122 determines the transmittance of the cumulative film from Table 2, for example, based on the calculated heater power difference.

TABLE 2

| Temperature zone | Heater power difference (Difference between heater power and virtual power) | Film thickness amount of cumulative film (nm) | Transmittance | ~ |
|---|---|---|---|---|
| 0-100 | 0 | 0 | 1 | ~ |
| 0-100 | 20 | 230 | 0.84 | ~ |
| 0-100 | 40 | 450 | 0.61 | ~ |
| 0-100 | 60 | 620 | 0.52 | ~ |
| 0-100 | 120 | 850 | 0.47 | ~ |
| 0-100 | 180 | 1060 | 0.39 | ~ |
| 100-200 | 0 | 0 | 1 | ~ |
| 100-200 | 20 | 240 | 0.85 | ~ |
| 100-200 | 40 | 460 | 0.63 | ~ |
| 100-200 | 60 | 610 | 0.5 | ~ |
| 100-200 | 120 | 830 | 0.46 | ~ |
| 100-200 | 180 | 1050 | 0.38 | ~ |
| ~ | ~ | ~ | ~ | ~ |

For example, Table 2 may be set for each unit area. Further, in Table 2, since the transmittance of the cumulative film changes for each temperature range, the heater power difference is associated with the transmittance of the cumulative film for each temperature zone.

The item "Heater power difference" in Table 2 is the difference between the heater power determined by the temperature control unit and the virtual power determined by the virtual temperature control unit. The items "Film thickness amount of cumulative film" and "Transmittance" in Table 2 may be obtained from experimental results.

Figure 8:
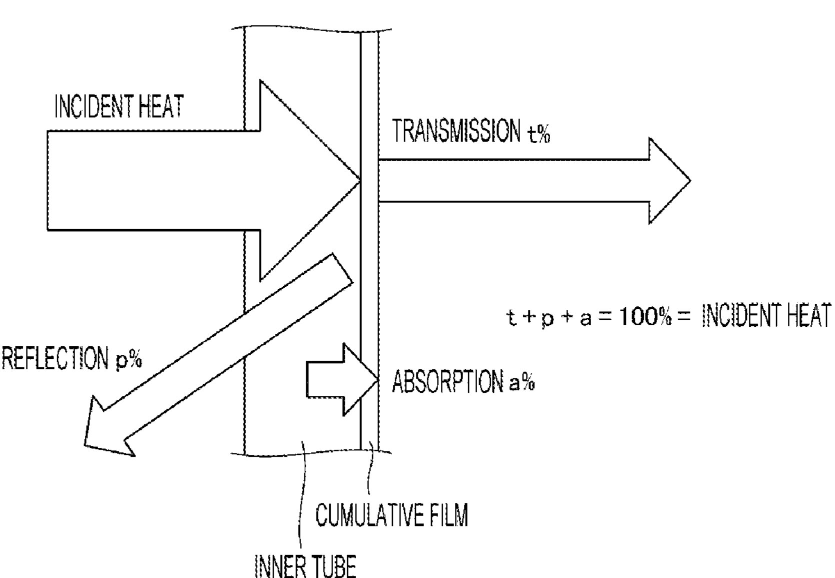
FIG. 8 is an exemplary diagram illustrating the transmittance of a cumulative film.

FIG. 8 is an exemplary diagram illustrating the transmittance of the cumulative film. As illustrated in FIG. 8, the transmittance of the cumulative film is the percentage of heat from the heater 63 passing through the cumulative film. FIG. 8 shows that t % of the incident heat from the heater 63 passes through the cumulative film, p % is reflected by the cumulative film, and a % is absorbed by the cumulative film. In FIG. 8, the transmittance of the cumulative film is t %.

Returning to FIG. 7, the virtual power determiner 124 applies the transmittance of the cumulative film, determined by the transmittance determiner 122, to the simulation model 114 to adjust the virtual power output by the virtual power output unit 120 so that the predicted temperature of the wafer W approaches a set temperature.

The power adjuster 126 may apply the virtual power adjusted by the virtual power determiner 124 to the heater power supplied from the heater output unit 86 to the heater 63, thereby reducing the influence of the cumulative film adhering inside the processing container 65.

Figure 9:
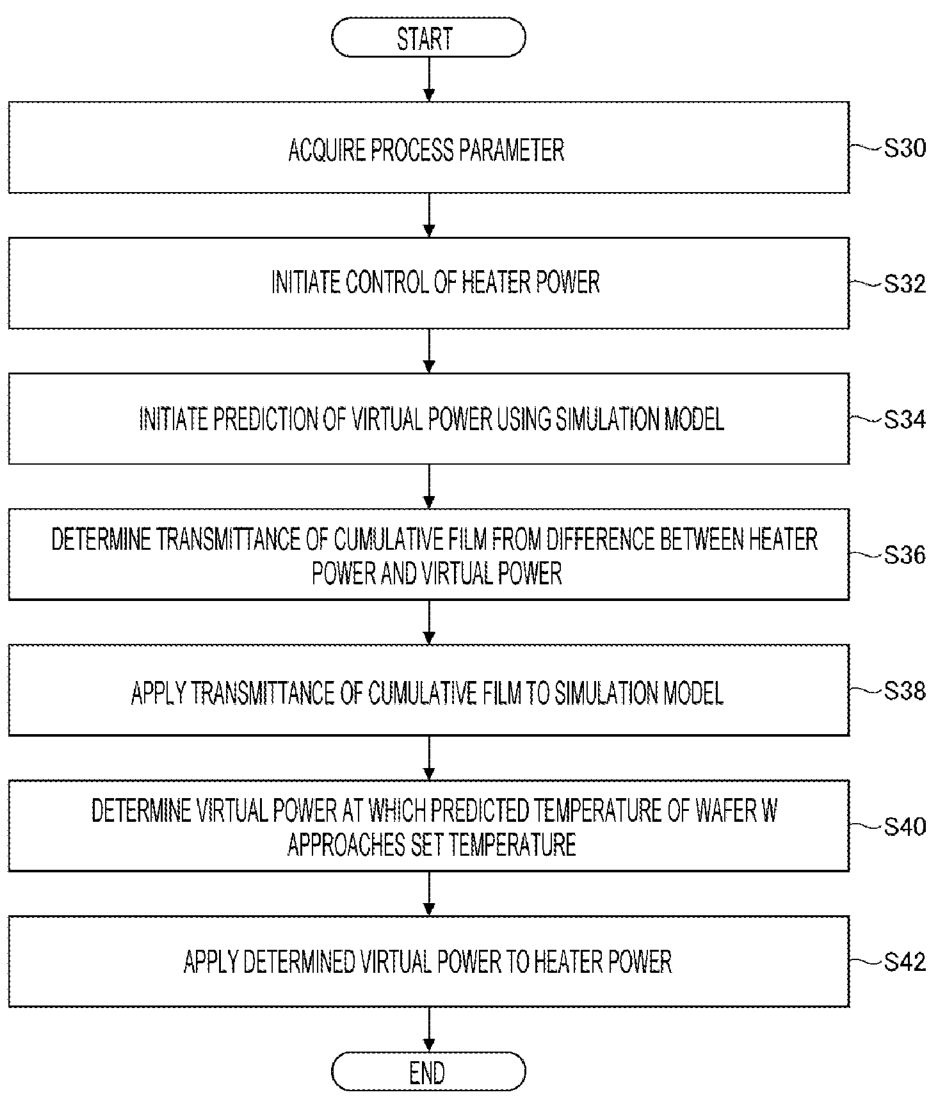
FIG. 9 is a flowchart illustrating an exemplary processing procedure of the control unit according to the present embodiment.

FIG. 9 is a flowchart illustrating an exemplary processing procedure of the control unit according to the present embodiment. In step S30, the control unit 100 of the heat treatment apparatus 10 acquires process parameters of a process executed by the heat treatment apparatus 10.

In step S32, the process control unit 106 of the control unit 100 executes the process in the heat treatment apparatus 10 based on the acquired process parameters, and initiates the control of the heater power supplied to the heater 63. This leads to the adjustment of the temperature inside the processing container 65 based on a set temperature.

In step S34, the prediction unit 110 of the control unit 100 uses the virtual temperature control unit and the simulation model 114 to initiate the prediction of the virtual power. For example, the virtual temperature control unit of the virtual power output unit 120 determines the virtual power based on the set temperature inside the processing container 65 and the predicted temperature of the inner T/C provided from the temperature prediction unit 112. The temperature prediction unit 112 uses the simulation model 114 of the heat treatment apparatus 10 to predict the temperature of the inner T/C based on the virtual power, and feeds back the predicted temperature to the virtual power output unit 120.

In step S36, the adjustment unit 116 of the control unit 100 determines the transmittance of the cumulative film based on a difference between the heater power notified from the heating control unit 108 and the virtual power notified from the virtual power output unit 120. In step S38, the adjustment unit 116 applies the determined transmittance of the cumulative film to the simulation model 114.

Further, in step S40, the adjuster 116 uses the simulation model 114, to which the determined transmittance of the cumulative film is applied, to determine the virtual power at which the predicted temperature of the wafer W approaches the set temperature. In step S42, the adjuster 116 applies the determined virtual power to the heater power supplied from the heater output unit 86 to the heater 63, thereby reducing the influence of the cumulative film adhering inside the processing container 65.

In this way, in the heat treatment apparatus 10 having the functional configuration of FIG. 7, the transmittance of the cumulative film may be determined by comparing the heater power supplied to the heater 63 and the virtual power predicted by the prediction unit 110, so that the heater power may be adjusted so as to reduce the influence of the cumulative film adhering inside the tube by predicting the temperature of the wafer W using the simulation model 114 to which the transmittance is applied.

Figure 10:
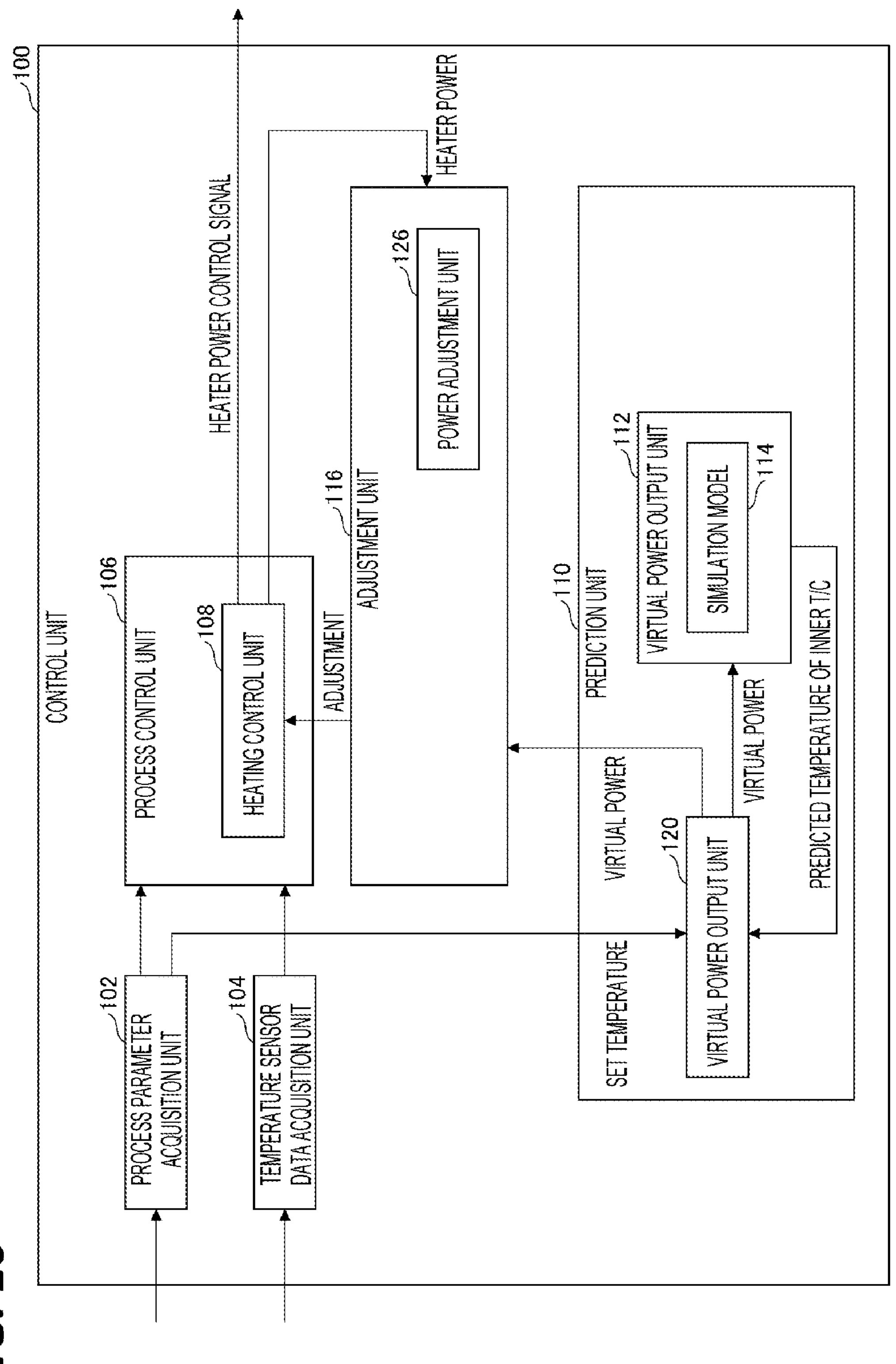
FIG. 10 is a diagram illustrating an exemplary functional configuration of the control unit of the heat treatment apparatus according to the present embodiment.

The control unit 100 of the heat treatment apparatus 10 may be implemented by a functional configuration illustrated in, for example, FIG. 10. FIG. 10 is a diagram illustrating an exemplary functional configuration of the control unit of the heat treatment apparatus according to the present embodiment. In the functional block diagram of FIG. 10, illustration of components unnecessary for the description of the present embodiment is omitted. Further, the functional block diagram of FIG. 10 is the same as the functional block diagram of FIG. 7 except for some parts, and description thereof will be omitted as appropriate.

The control unit 100 implements the process parameter acquisition unit 102, the temperature sensor data acquisition unit 104, the process control unit 106, the heating control unit 108, the prediction unit 110, and the adjustment unit 116 by executing a program. The prediction unit 110 includes the temperature detector 112, the simulation model 114, and the virtual power output unit 120. Further, the adjustment unit 116 includes the power adjustment unit 126.

The process parameter acquisition unit 102, the temperature sensor data acquisition unit 104, the process control unit 106, and the heating control unit 108 are the same as in the functional block diagram of FIG. 7. Further, the temperature prediction unit 112, the simulation model 114, and the virtual power output unit 120 of the prediction unit 110 are the same as in the functional block diagram of FIG. 7.

The virtual temperature control unit included in the virtual power output unit 120 calculates the virtual power supplied to the heater 63 based on the set temperature inside the processing container 65, provided from the process parameter acquisition unit 102, and the predicted temperature of the inner T/C provided from the temperature prediction unit 112. The virtual power output unit 120 provides the calculated virtual power to the temperature prediction unit 112. Further, the virtual power output unit 120 provides the calculated virtual power to the adjustment unit 116.

The simulation model 114 of the temperature prediction unit 112 outputs the predicted temperature of the inner T/C inside the processing container 65 in response to the input of the virtual power. The temperature prediction unit 112 uses the simulation model of the heat treatment apparatus 10 to predict the temperature of the inner T/C inside the processing container 65 based on the virtual power, and outputs it to the virtual power output unit 120.

Further, the heating control unit 108 notifies the adjuster 116 of the heater power determined by the temperature control unit. The power adjuster 126 of the adjuster 116 compares the heater power notified from the heating control unit 108 with the virtual power provided from the virtual power output unit 120 to calculate the heater power difference. The power adjuster 126 determines corrected heater power from Table 3, for example, based on the calculated heater power difference.

TABLE 3

| Temperature zone | Heater power difference (Difference between heater power and virtual power) | Corrected heater power | Film thickness amount of cumulative film (nm) | Transmittance | ~ |
|---|---|---|---|---|---|
| 0-100 | 0 | 0 | 0 | 1 | ~ |
| 0-100 | 20 | 22 | 230 | 0.84 | ~ |
| 0-100 | 40 | 41 | 450 | 0.61 | ~ |
| 0-100 | 60 | 65 | 620 | 0.52 | ~ |
| 0-100 | 120 | 124 | 850 | 0.47 | ~ |
| 0-100 | 180 | 182 | 1060 | 0.39 | ~ |
| 100-200 | 0 | 0 | 0 | 1 | ~ |
| 100-200 | 20 | 23 | 240 | 0.85 | ~ |
| 100-200 | 40 | 42 | 460 | 0.63 | ~ |
| 100-200 | 60 | 67 | 610 | 0.5 | ~ |
| 100-200 | 120 | 126 | 830 | 0.46 | ~ |
| 100-200 | 180 | 185 | 1050 | 0.38 | ~ |
| ~ | ~ | ~ | ~ | ~ | ~ |

For example, Table 3 may be set for each unit area. Further, in Table 3, since the transmittance of the cumulative film changes for each temperature zone, the heater power difference is associated with the corrected heater power for each temperature zone.

The item "Heater power difference" in Table 3 is the difference between the heater power determined by the temperature control unit and the virtual power determined by the virtual temperature control unit. The item "Corrected heater power" in Table 3 is heater power that reduces the influence of the cumulative film adhering inside the processing container 65. The heater power that reduces the influence of the cumulative film adhering inside the processing container 65 is heater power for bringing the temperature of the wafer W closer to the set temperature. The items "Corrected heater power," "Film thickness amount of cumulative film," and "Transmittance" in Table 3 may be obtained from experimental results. The items "Film thickness amount of cumulative film" and "Transmittance" in Table 3 are used for display screen, logs, and others.

Returning to FIG. 10, the power adjuster 126 of the adjuster 116 may apply the corrected heat power determined by using Table 3 to the heater power supplied from the heater output unit 86 to the heater 63, thereby reducing the influence of the cumulative film adhering inside the processing container 65.

Figure 11:
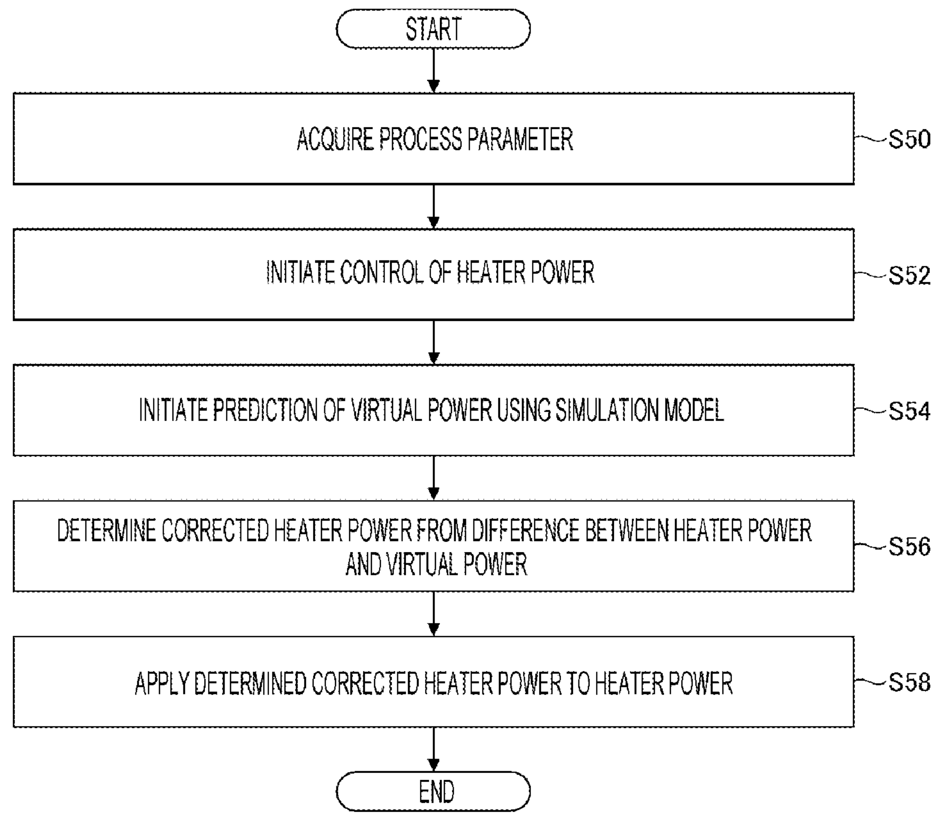
FIG. 11 is a flowchart illustrating an exemplary processing procedure of the control unit according to the present embodiment.

FIG. 11 is a flowchart illustrating an exemplary processing procedure of the control unit according to the present embodiment. The flowchart of FIG. 11 is the same as the flowchart of FIG. 9 except for some parts, and thus, description thereof will be omitted as appropriate.

Steps S50 to S54 are the same as steps S30 to S34 in FIG. 9. In step S56, the adjuster 116 of the control unit 100 compares the heater power notified from the heating control unit 108 with the virtual power notified from the virtual power output unit 120 to calculate the heater power difference. The adjuster 116 determines the corrected heater power corresponding to the calculated heater power difference by using, for example, Table 3.

In step S58, the adjuster 116 applies the determined corrected heater power to the heater power supplied from the heater output unit 86 to the heater 63, thereby reducing the influence of the cumulative film adhering inside the processing container 65.

In this way, in the heat treatment apparatus 10 having the functional configuration of FIG. 10, the corrected heater power may be determined based on the difference between the heater power supplied to the heater 63 and the virtual power predicted by the prediction unit 110, so that the heater power may be adjusted so as to reduce the influence of the cumulative film adhering inside the tube.

The control unit 100 of the heat treatment apparatus 10 may be implemented by a functional configuration illustrated in, for example, FIG. 12. FIG. 12 is a diagram illustrating an exemplary functional configuration of the control unit of the heat treatment apparatus according to the present embodiment. In the functional block diagram of FIG. 12, illustration of components unnecessary for the description of the present embodiment is omitted.

The control unit 100 implements the process parameter acquisition unit 102, the temperature sensor data acquisition unit 104, the process control unit 106, the heating control unit 108, the prediction unit 110, and the adjustment unit 116 by executing a program. The prediction unit 110 includes a first temperature prediction unit 112-1, a second temperature detector 112-2, a first simulation model 114-1, a second simulation model 114-2, and the virtual power output unit 120. Further, the adjustment unit 116 includes the virtual power determiner 124, the power adjustment unit 126, and a transmittance adjustment unit 130. Further, the functional block diagram of FIG. 12 contains the same parts as those in the above-described functional block diagrams, and description thereof will be omitted as appropriate.

The process parameter acquisition unit 102 acquires process parameters of a process executed by the heat treatment apparatus 10. The process parameter acquisition unit 102 provides the acquired process parameters to the process control unit 106. The process parameters include the set temperature inside the processing container 65. Further, the process parameter acquisition unit 102 provides the set temperature inside the processing container 65 to the virtual power output unit 120.

The temperature sensor data acquisition unit 104 acquires the measured temperature of the inner T/C. The temperature sensor data acquisition unit 104 provides the acquired measured temperature of the inner T/C to the process control unit 106.

The process control unit 106 executes a process in the heat treatment apparatus 10 based on the process parameters provided from the process parameter acquisition unit 102. The temperature control unit of the process control unit 106 determines the heater power based on the provided measured temperature and set temperature inside the processing container 65. The heating control unit 108 provides a heater power control signal to the heater output unit 86, thereby controlling the supply of the heater power from the heater output unit 86 to the heater 63. The heating control unit 108 notifies the first temperature prediction unit 112-1 of the prediction unit 110 of the heater power determined by the temperature control unit.

The first temperature prediction unit 112-1 includes the first simulation model 114-1. The first simulation model 114-1 is the same as the simulation model 114 of the heat treatment apparatus 10. The first simulation model 114-1 predicts the temperature measured by the inner T/C inside the processing container 65 based on the heater power determined by the temperature control unit, and outputs it as a first predicted temperature of the inner T/C inside the processing container 65 to the adjuster 116.

The virtual temperature control unit of the virtual power output unit 120 calculates the virtual power based on the set temperature inside the processing container 65 provided from the process parameter acquisition unit 102 and a second predicted temperature of the inner T/C provided from the second temperature prediction unit 112-2. The virtual power output unit 120 provides the calculated virtual power to the second temperature prediction unit 112-2.

The second temperature prediction unit 112-2 includes the second simulation model 114-2 of the heat treatment apparatus 10. The second simulation model 114-2 is the same as the simulation model 114 of FIG. 7. The second simulation model 114-2 predicts the temperature measured by the inner T/C inside the processing container 65 based on the virtual power and the transmittance of the cumulative film, and outputs it as a second predicted temperature of the inner T/C inside the processing container 65 to the adjuster 116 and the virtual power output unit 120. Further, the second simulation model 114-2 may predict the temperature of the wafer W based on the virtual power and the transmittance of the cumulative film, and may output it as the predicted temperature of the wafer W to the adjuster 116. The second temperature prediction unit 112-2 outputs (feeds back) the second predicted temperature of the inner T/C to the virtual power output unit 120.

Further, the heating control unit 108 notifies the adjuster 116 of the heater power determined by the temperature control unit. The transmittance adjuster 130 of the adjuster 116 calculates a difference between the first predicted temperature of the inner T/C provided from the first temperature prediction unit 112-1 and the second predicted temperature of the inner T/C provided from the second temperature prediction unit 112-2.

The transmittance adjuster 130 adjusts the transmittance of the cumulative film of the second simulation model 114-2 so as to reduce the difference between the first predicted temperature of the inner T/C and the second predicted temperature of the inner T/C.

The virtual power determiner 124 adjusts the virtual power output by the virtual power output unit 120 so that the predicted temperature of the wafer W, which is predicted by the second simulation model 114-2 in which the transmittance of the cumulative film is adjusted by the transmittance adjuster 130, approaches the set temperature.

The power adjuster 126 may apply the virtual power adjusted by the virtual power determiner 124 to the heater power supplied from the heater output unit 86 to the heater 63, thereby reducing the influence of the cumulative film adhering inside the processing container 65.

The control unit 100 of FIG. 12 may obtain the transmittance of the cumulative film and the film thickness amount of the cumulative film by using, for example, Table 4, and utilize them for screen information, logs, and others. For example, Table 4 may be set for each unit area. Further, in Table 4, since the transmittance of the cumulative film changes for each temperature zone, the transmittance of the cumulative film and the film thickness amount of the cumulative film may be set for each temperature zone. The items "Transmittance" and "Film thickness amount of cumulative film" in Table 4 may be obtained from experimental results.

TABLE 4

| Temperature zone | Transmittance | Film thickness amount of cumulative film | ~ |
|---|---|---|---|
| 0-100 | 1 | 0 | ~ |
| 0-100 | 0.84 | 230 | ~ |
| 0-100 | 0.61 | 450 | ~ |
| 0-100 | 0.52 | 620 | ~ |
| 0-100 | 0.47 | 850 | ~ |
| 0-100 | 0.39 | 1060 | ~ |
| 100-200 | 1 | 0 | ~ |
| 100-200 | 0.85 | 240 | ~ |
| 100-200 | 0.63 | 460 | ~ |
| 100-200 | 0.5 | 610 | ~ |
| 100-200 | 0.46 | 830 | ~ |

TABLE 4-continued

| Temperature zone | Transmittance | Film thickness amount of cumulative film | ~ |
| --- | --- | --- | --- |
| 100-200 | 0.38 | 1050 | ~ |
| ~ | ~ | ~ | ~ |

Figure 13:
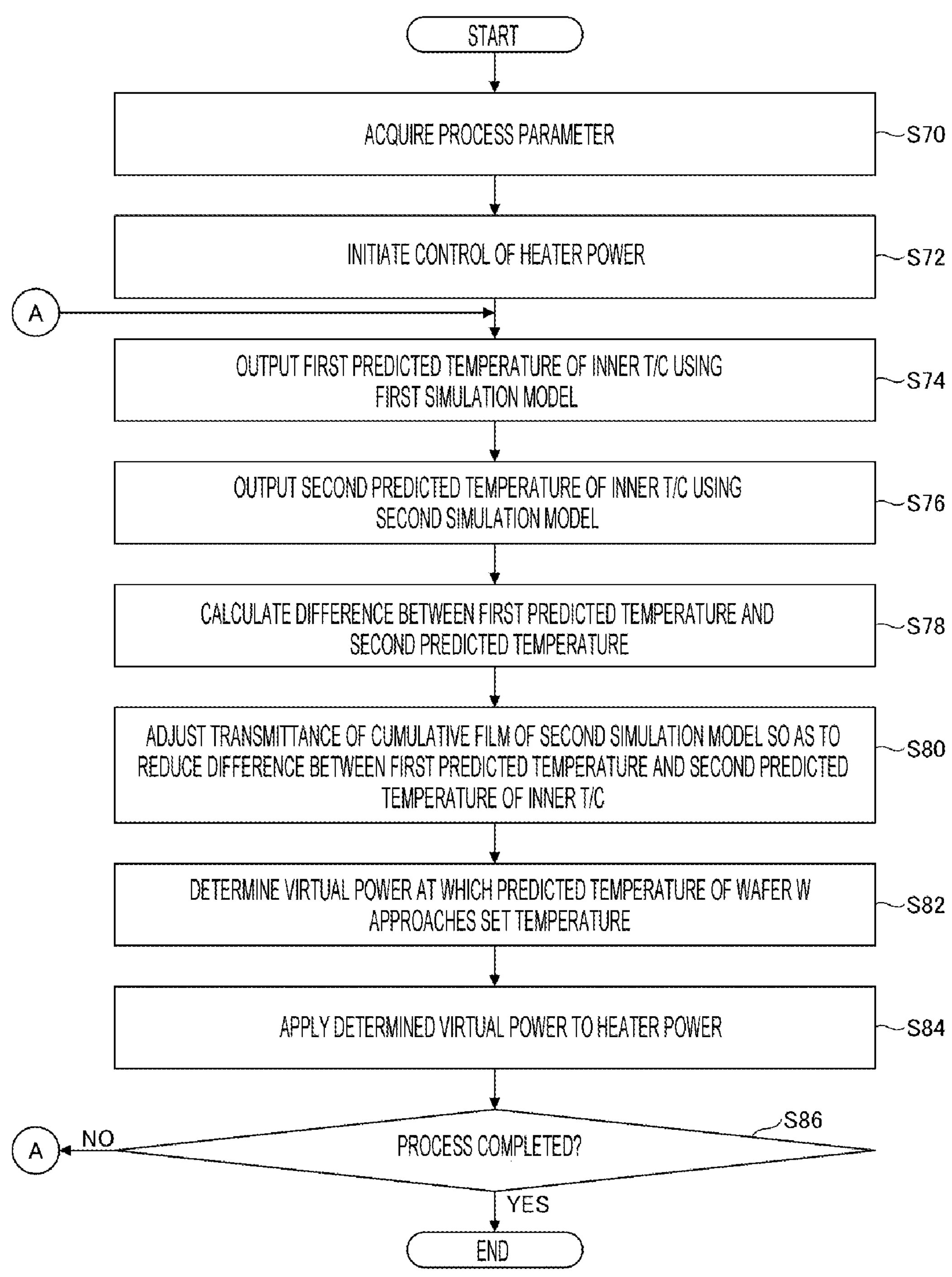
FIG. 13 is a flowchart illustrating an exemplary processing procedure of the control unit according to the present embodiment.

FIG. 13 is a flowchart illustrating an exemplary processing procedure of the control unit according to the present embodiment. In step S70, the control unit 100 of the heat treatment apparatus 10 acquires process parameters of a process executed by the heat treatment apparatus 10.

In step S72, the process control unit 106 of the control unit 100 executes the process in the heat treatment apparatus 10 based on the acquired process parameters, and initiates the control of the heater power supplied to the heater 63. This leads to the adjustment of the temperature inside the processing container 65 based on a set temperature.

In step S74, the first temperature prediction unit 112-1 uses the first simulation model 114-1 to output the first predicted temperature of the inner T/C. In step S76, the second temperature prediction unit 112-2 uses the first simulation model 114-2 to output the second predicted temperature of the inner T/C.

In step S78, the transmittance adjuster 130 calculates a difference between the first predicted temperature of the inner T/C provided from the first temperature prediction unit 112-1 and the second predicted temperature of the inner T/C provided from the second temperature prediction unit 112-2.

In step S80, the transmittance adjuster 130 adjusts the transmittance of the cumulative film of the second simulation model 114-2 so as to reduce the difference between the first predicted temperature of the inner T/C and the second predicted temperature of the inner T/C.

In step S82, the virtual power determiner 124 causes the second simulation model 114-2 in which the transmittance of the cumulative film is adjusted by the transmittance adjuster 130 to output the predicted temperature of the wafer W. The virtual power determiner 124 adjusts the virtual power output by the virtual power output unit 120 so that the predicted temperature of the wafer W output by the second simulation model 114-2 approaches the set temperature.

In step S84, the power adjuster 126 applies the virtual power adjusted by the virtual power determiner 124 to the heater power supplied from the heater output unit 86 to the heater 63, thereby reducing the influence of the cumulative film adhering inside the processing container 65. The control unit 100 repeats the processings of steps S74 to S86 until the process is completed.

In this way, in the heat treatment apparatus 10 having the functional configuration of FIG. 13, the transmittance of the cumulative film of the second simulation model 114-2 is adjusted and the temperature of the wafer W is predicted by the second simulation model 114-2 after the adjustment of the transmittance, so that the heater power may be adjusted so as to reduce the influence of the cumulative film adhering inside the tube.

According to the present embodiment, it is possible to more accurately control the amount of heat reaching the wafer W (temperature of the wafer W) even in a state where the cumulative film is adhering inside the tube. Thus, according to the present embodiment, the fluctuation of the wafer W due to the cumulative film may be reduced, resulting in improved process performance.

The control unit 100 of the heat treatment apparatus 10 may reduce the influence of the cumulative film from the heat treatment apparatus 10 during the execution of a heat treatment by utilizing digital twin technology.

In the above-described embodiment, the control unit 100 of the heat treatment apparatus 10 was responsible for a reduction in the influence of the cumulative film of the heat treatment apparatus 10. The processing of reducing the influence of the cumulative film of the heat treatment apparatus 10 may also be executed by other information processing apparatuses that are connected to the control unit 100 to enable data communication therebetween.

Figure 14:
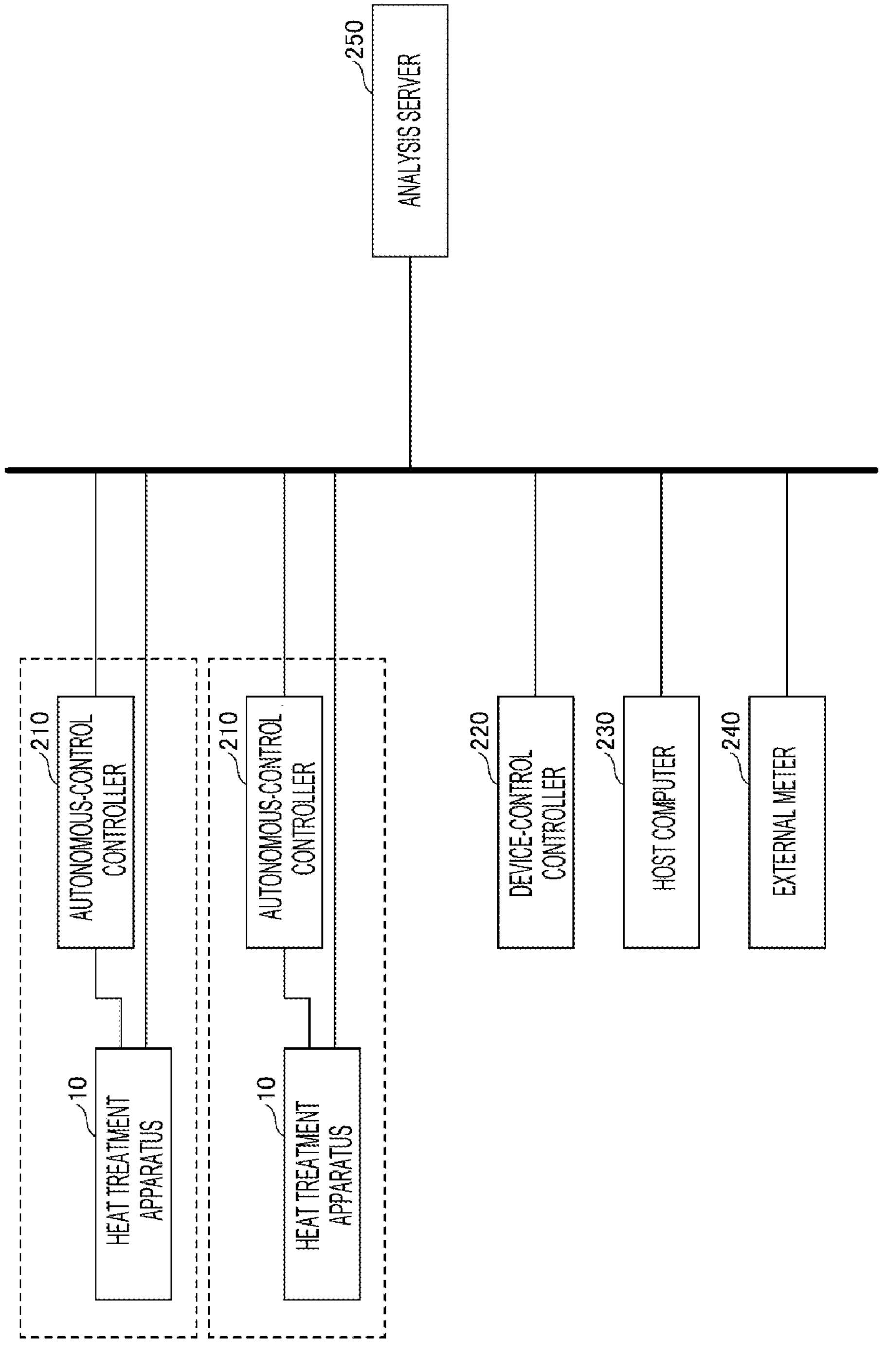
FIG. 14 is a diagram illustrating an exemplary configuration of an information processing system according to the present embodiment.

FIG. 14 is a diagram illustrating an example configuration of an information processing system according to the present embodiment. The information processing system of FIG. 14 includes the heat treatment apparatus 10, an autonomous-control controller 210, a device-control controller 220, a host computer 230, an external meter 240, and an analysis server 250.

The heat treatment apparatus 10, the autonomous-control controller 210, the device-control controller 220, the host computer 230, the external meter 240, and the analysis server 250 are connected to enable communication therebetween via a network such as a local area network (LAN).

The heat treatment apparatus 10 executes a process in response to a control command (process parameters) output from the device-control controller 220. The autonomous-control controller 210 is configured to autonomously control the heat treatment apparatus 10 and performs tasks such as the simulation of process statuses during the execution of a process by the heat treatment apparatus 10, by utilizing a simulation model. The autonomous-control controller 210 is provided for each heat treatment apparatus 10. The autonomous-control controller 210 executes a processing of reducing the influence of the cumulative film in the heat treatment apparatus 10, which is performed by the control unit 100 in the above-described embodiment.

Further, the device-control controller 220 is a controller having a computer configuration for controlling the heat treatment apparatus 10. The device-control controller 220 outputs process parameters, used for the control of control components of the heat treatment apparatus 10, to the heat treatment apparatus 10. The host computer 230 is an example man machine interface (MMI) that receives instructions regarding the heat treatment apparatus 10 from an operator and provides information regarding the heat treatment apparatus 10 to the operator.

The external meter 240 is a meter that measures the results after the execution of the process based on the process parameters, such as a film thickness meter, a sheet resistance meter, and a particle meter. For example, the external meter 240 measures the adhesion state of a film on a wafer such as a monitor wafer.

The analysis server 250 performs, for example, data analysis necessary for the processing executed by the autonomous-control controller 210. The analysis server 250 may be adapted to edit the simulation model of the heat treatment apparatus 10 with machine learning or other techniques based on data collected from a plurality of heat treatment apparatuses 10.

The information processing system of FIG. 14 is merely one example, and it goes without saying that there are various system configuration examples depending on the application and purpose. The categorization of devices such as the heat treatment apparatus 10, the autonomous-control controller 210, the device-control controller 220, the host computer 230, the external meter 240, and the analysis server 250 illustrated in FIG. 14 is provided as an example.

For example, the information processing system may have various configurations, such as the integrated configuration of at least two devices among the heat treatment apparatus 10, the autonomous-control controller 210, the device-control controller 220, the host computer 230, the external meter 240, and the analysis server 250, or further division into separate configurations.

Figure 15:
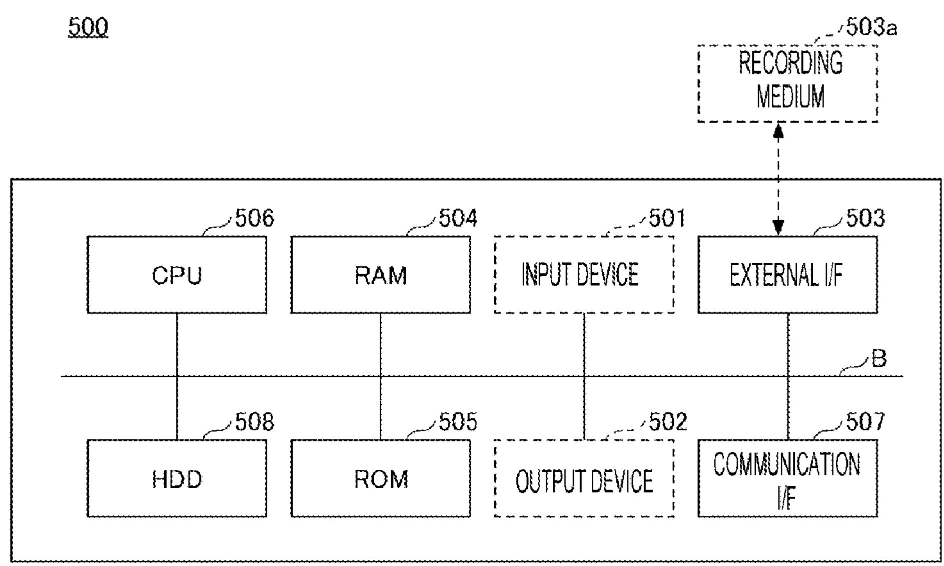
FIG. 15 is a diagram illustrating an exemplary hardware configuration of a computer.

The autonomous-control controller 210, the device-control controller 220, the host computer 230, and the analysis server 250 of the information processing system of FIG. 14 are implemented by, for example, a computer having a hardware configuration of FIG. 15. Further, the control unit 100 of the heat treatment apparatus 10 described above is also implemented by a computer having a hardware configuration of FIG. 15. FIG. 15 is a diagram illustrating an exemplary hardware configuration of a computer.

A computer 500 of FIG. 15 includes an input device 501, an output device 502, an external interface (I/F) 503, a random access memory (RAM) 504, a read only memory (ROM) 505, a central processing unit (CPU) 506, a communication I/F 507, and a hard disk drive (HDD) 508, among others, and the respective components are connected to each other via a bus B. The input device 501 and the output device 502 may be connected and used as needed.

The input device 501 includes devices such as a keyboard, a mouse, and a touch panel, which are used by an operator or user to input each operation signal. The output device 502 is a display or similar device, which is used to display the processing results generated by the computer 500. The communication I/F 507 is an interface that connects the computer 500 to a network. The HDD 508 is an example of a non-volatile storage device used to store programs and data.

The external I/F 503 is an interface to an external device. The computer 500 may perform reading from and/or writing to a recording medium 503*a*, such as a secure digital (SD) memory card, via the external I/F 503. The ROM 505 is an example of a non-volatile semiconductor memory (storage device) in which programs and data are stored. The RAM 504 is an example of a volatile semiconductor memory (storage device) used to temporarily hold programs and data.

The CPU 506 is an arithmetic unit that reads out programs and data from storage devices such as the ROM 505 and the HDD 508 onto the RAM 504 and executes a processing to implement the overall control and functions of the computer 500.

The autonomous-control controller 210, the device-control controller 220, the host computer 230, and the analysis server 250 of the information processing system of FIG. 14 may implement various functions by the hardware configuration of the computer 500 in FIG. 15. Further, the control unit 100 of the heat treatment apparatus 10 described above may also implement various functions by the hardware configuration of the computer 500 illustrated in FIG. 15.

In the present embodiment, the digital twin of the actual heat treatment apparatus 10 and the simulated heat treatment apparatus 10 is implemented by causing the autonomous-control controller 210 to execute a physical model simulation using real-time process parameters of the heat treatment apparatus 10. Information obtained from the actual heat treatment apparatus 10 (e.g., heater power and measured temperature) and information obtained from the simulation (e.g., virtual power and predicted temperature) are compared in real time, so that the influence of the cumulative film of the heat treatment apparatus 10 during the execution of a heat treatment may be predicted and a processing of reducing the influence of the cumulative film may be executed.

By using the technique of the above-described embodiment, the heat treatment apparatus 10 according to the present embodiment may implement an extended cleaning cycle in the presence of the cumulative film. For equipment that does not perform cleaning for each process (equipment that does not operate under One Depo Edge Depo), the influence of the cumulative film may be reduced, and therefore, the number of steps of removing the cumulative film (dry cleaning or wet etching during maintenance) may be reduced. Accordingly, the heat treatment apparatus 10 according to the present embodiment may achieve an improved production efficiency owing to a reduced downtime, and may reduce environmental load due to cleaning.

Further, for equipment that performs cleaning for each process (equipment that operates under One Depo Edge Depo), in cases of urgent production, it becomes possible to shorten the dry cleaning time between processes and prioritize the processing of the wafer W. During idle periods, the cumulative film may be cleaned rapidly, enabling efficient handling.

Further, the heat treatment apparatus 10 according to the present embodiment may autonomously set the frequency and quantity of dry cleaning. Even for equipment that performs cleaning for each process, the heat treatment apparatus 10 according to the present embodiment may adjust the heater power in consideration of the influence of the cumulative film slightly adhering during the process, which may contribute to improved performance and extended lifespan, especially in critical processes.

Further, by applying the technique of the above-described embodiment to a dry cleaning process, the heat treatment apparatus 10 according to the present embodiment may implement an improvement in the end point detection of dry cleaning, a reduction in dry cleaning time, and a reduction in gas consumption during dry cleaning.

Figure 16:
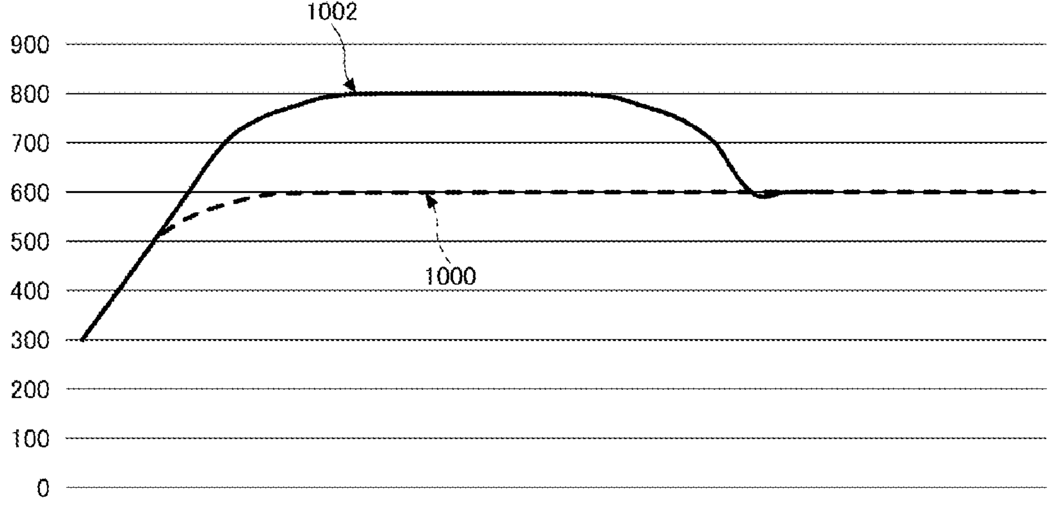
FIG. 16 is an exemplary diagram illustrating dry cleaning end point detection, time reduction, and gas consumption reduction.

FIG. 16 is an exemplary diagram illustrating dry cleaning end point detection, time reduction, and reduction of gas consumption. Graph 1000 in FIG. 16 shows an example of the internal temperature of the processing container 65 during conventional dry cleaning. Graph 1002 shows an example of the internal temperature of the processing container 65 during dry cleaning of the heat treatment apparatus 10 according to the present embodiment.

In the conventional dry cleaning, since the amount and rate of removing the cumulative film are constant, as illustrated in graph 1000, a cleaning gas is flowed to perform cleaning in a temperature stable state after stabilizing the inside of a furnace in a constant temperature state. In the dry cleaning of the heat treatment apparatus 10 according to the present embodiment, since the amount of removing the cumulative film may be controlled even without reaching a temperature stable state as illustrated in graph 1002, the cleaning gas may be flowed before reaching the temperature stable state, which may result in a reduction of cleaning time.

Further, the conventional dry cleaning is often conducted at lower temperatures to prevent excessive removal of the cumulative film, which may potentially result in the removal of quartz, although a desired large amount of cumulative film will be removed at higher temperatures. Additionally, using the lower temperature helps mitigate the issue of longer time required to achieve a temperature stable state at higher temperatures. In the present embodiment, the dry cleaning temperature is raised until the cumulative film is removed and brought closer to quartz (end point). Once it approaches the end point, the dry cleaning temperature is lowered, thereby implementing both the reduction of the dry cleaning time and the reduction of gas consumption.

Figure 17:
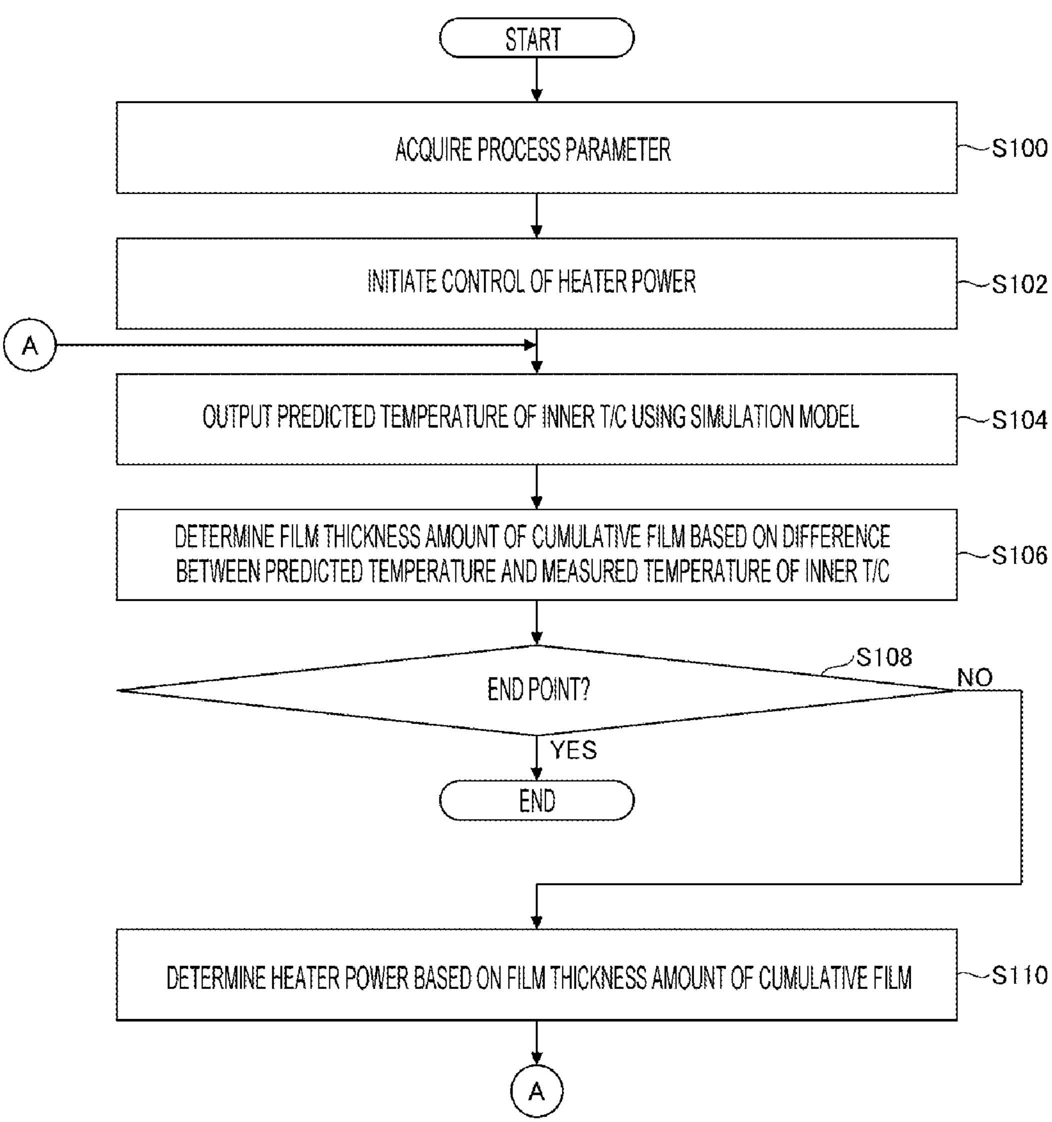
FIG. 17 is an exemplary diagram illustrating dry cleaning end point detection according to the present embodiment.

The dry cleaning end point is detected as illustrated in, for example, FIG. 17. FIG. 17 is an exemplary diagram illustrating dry cleaning end point detection according to the present embodiment.

In step S100, the control unit 100 of the heat treatment apparatus 10 acquires process parameters of a dry cleaning process executed by the heat treatment apparatus 10. In step S102, the process control unit 106 of the control unit 100 executes a dry cleaning process in the heat treatment apparatus 10 based on the acquired process parameters, and initiates the control of the heater power supplied to the heater 63.

In step S104, the prediction unit 110 of the control unit 100 uses the simulation model 114 without the cumulative film adhering thereto to output the predicted temperature of the inner T/C inside the processing container 65 based on the heater power supplied to the heater 63 of the heat treatment apparatus 10.

In step S106, the adjuster 116 of the control unit 100 compares the measured temperature of the inner T/C provided from the temperature sensor data acquisition unit 104 and the predicted temperature of the inner T/C inside the processing container 65 provided from the temperature prediction unit 112 to calculate a difference between the measured temperature and the predicted temperature of the inner T/C. The adjuster 116 determines the film thickness amount of the cumulative film based on the calculated difference.

In step S108, the adjuster 116 determines whether or not the end point is reached based on the determined film thickness amount of the cumulative film. When it is determined that the end point is not reached, the adjuster 116 proceeds to the processing of step S110 to adjust the heater power based on the determined film thickness amount of the cumulative film, and returns to the processing of step S104. When it is determined that the end point has been reached, the adjuster 116 ends the dry cleaning process.

Further, the end point detection of dry cleaning may be achieved by creating a table that shows how much may be removed per unit time in terms of temperature, pressure, and gas quantity. By accumulating the removed amount, it is possible to control the amount of film removal relative to the film thickness amount of the cumulative film. The end point detection of dry cleaning using a table and the end point detection illustrated in FIG. 17 may be used together to further improve safety. Furthermore, modeling of a processing of removing the cumulative film during dry cleaning may be performed.

According to the present disclosure, it is possible to reduce the influence of a cumulative film adhering inside a processing container by using a simulation model.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An information processing system comprising:

a heat treatment apparatus configured to form a film on a processing target substrate by using a heater that heats the processing target substrate inside a processing container; and an information processing apparatus configured to control power supplied to the heater, wherein the heat treatment apparatus includes:

a prediction circuitry configured to predict an influence of a cumulative film adhering inside the processing container, on a temperature of the processing target substrate by using a simulation model of the heat treatment apparatus; and an adjustment circuitry configured to adjust the power supplied to the heater based on the predicted influence of the cumulative film adhering inside the processing container, on the temperature of the processing target substrate, the prediction circuitry includes a virtual power output circuitry configured to output a virtual power supplied to the simulation model of the heat treatment apparatus based on a set temperature in the processing container and a predicted temperature in the processing container; and a temperature prediction circuitry configured to output the predicted temperature in the processing container, based on at least one of the power supplied to the heater or the virtual power, by using the simulation model of the heat treatment apparatus, and the adjustment circuitry is configured to determine the virtual power at which the predicted temperature of the processing target substrate inside the processing container approaches the set temperature in the processing container, by using the simulation model to which a transmittance of the cumulative film adhering inside the processing container is applied; and adjust the power supplied to the heater based on the predicted temperature and the virtual power.

2. The information processing system according to claim 1, wherein the prediction circuitry is configured to output the predicted temperature in the processing container based on the power supplied to the heater in a state where no cumulative film adheres inside the processing container, by using the simulation model of the heat treatment apparatus, and wherein the adjustment circuitry is configured to adjust the power supplied to the heater during a cleaning processing of removing the cumulative film inside the processing container, based on a difference between a measured temperature in the processing container and the predicted temperature in the processing container.

3. The information processing system according to claim 2, wherein the adjustment circuitry is configured to detect an end point at which the cleaning processing needs to be terminated based on the difference between the measured temperature in the processing container and the predicted temperature in the processing container.

4. The information processing system according to claim 1, wherein the prediction circuitry is configured to output the predicted temperature in the processing container based on the power supplied to the heater, by using the simulation model of the heat treatment apparatus, and the adjustment circuitry is configured to adjust the power supplied to the heater based on a difference between a measured temperature in the processing container and the predicted temperature in the processing container.

5. The information processing system according to claim 1, wherein the temperature prediction circuitry is configured to output the predicted temperature in the processing container, based on the virtual power, to the virtual power output circuitry by using the simulation model of the heat treatment apparatus, and wherein the adjustment circuitry includes:

a transmittance determination circuitry configured to determine the transmittance of the cumulative film adhering inside the processing container based on a difference between the power supplied to the heater and the virtual power;

a virtual power determination circuitry configured to determine the virtual power at which the predicted temperature of the processing target substrate inside the processing container approaches the set temperature in the processing container, by using the simulation model of the heat treatment apparatus to which the determined transmittance is applied; and a power adjustment circuitry configured to adjust the power supplied to the heater based on the determined virtual power.

6. The information processing system according to claim 1, wherein the temperature prediction circuitry is configured to output the predicted temperature inside the processing container, based on the virtual power, to the virtual power output circuitry by using the simulation model of the heat treatment apparatus, and wherein the adjustment circuitry includes a power adjustment circuitry configured to adjust the power supplied to the heater based on a difference between the power supplied to the heater and the virtual power.

7. The information processing system according to claim 1, wherein the temperature prediction circuitry includes:

a first temperature prediction circuitry configured to output a first predicted temperature in the processing container based on the power supplied to the heater by using a first simulation model of the heat treatment apparatus; and a second temperature prediction circuitry configured to output a second predicted temperature in the processing container based on virtual power by using a second simulation model of the heat treatment apparatus to which the transmittance of the cumulative film adhering inside the processing container is applicable, wherein the virtual power output circuitry is configured to output the virtual power supplied to the second simulation model of the heat treatment apparatus based on a set temperature in the processing container and the second predicted temperature in the processing container, and wherein the adjustment circuitry includes:

a transmittance adjustment circuitry configured to adjust the transmittance applied to the second simulation model of the heat treatment apparatus based on a difference between the first predicted temperature and the second predicted temperature;

a virtual power determination circuitry configured to determine the virtual power at which the predicted temperature of the processing target substrate inside the processing container, which is predicted by the second simulation model of the heat treatment apparatus after adjustment of the transmittance, approaches the set temperature in the processing container; and a power adjustment circuitry configured to adjust the power supplied to the heater based on the determined virtual power.

8. The information processing system according to claim 1, wherein the heater corresponds to one of a plurality of unit areas obtained by dividing an area inside the processing container, and wherein the adjustment circuitry is configured to adjust the power supplied to the heater for each unit area.

9. The information processing system according to claim 1, wherein the simulation model of the heat treatment apparatus is a thermal model that predicts a temperature measured by a temperature sensor inside the processing container and the temperature of the processing target substrate inside the processing container.

10. The information processing system according to claim 1, wherein the adjustment circuitry is configured to adjust the power supplied to the heater based on at least one of a difference between the predicted temperature and a measured temperature in the processing container, a difference between the virtual power and the power supplied to the heater, and a difference between a plurality of the predicted temperatures.

11. A power adjustment method comprising:

providing an information processing system including:

a heat treatment apparatus configured to form a film on a processing target substrate by using a heater that heats the processing target substrate inside a processing container; and an information processing apparatus configured to control power supplied to the heater, predicting an influence of a cumulative film adhering inside the processing container, on a temperature of the processing target substrate by using a simulation model of the heat treatment apparatus; and adjusting the power supplied to the heater based on the predicted influence of the cumulative film adhering inside the processing container, on the temperature of the processing target substrate, wherein the predicting includes outputting a virtual power supplied to the simulation model of the heat treatment apparatus based on a set temperature in the processing container and a predicted temperature in the processing container; and outputting the predicted temperature in the processing container, based on at least one of the power supplied to the heater or the virtual power, by using the simulation model of the heat treatment apparatus, and the adjusting includes;

determining the virtual power at which the predicted temperature of the processing target substrate inside the processing container approaches the set temperature in the processing container, by using the simulation model to which a transmittance of the cumulative film adhering inside the processing container is applied; and adjusting the power supplied to the heater based on the predicted temperature and the virtual power.

12. A heat treatment apparatus comprising:

a processing container configured to accommodate a processing target substrate;

a heater configured to heat the processing target substrate inside the processing container;

a prediction circuitry configured to predict an influence of a cumulative film adhering inside the processing container, on a temperature of the processing target substrate by using a simulation model of the heat treatment apparatus; and an adjustment circuitry configured to adjust power supplied to the heater based on the predicted influence of the cumulative film adhering inside the processing container, on the temperature of the processing target substrate, wherein the prediction circuitry includes a virtual power output circuitry configured to output a virtual power supplied to the simulation model of the heat treatment apparatus based on a set temperature in the processing container and a predicted temperature in the processing container; and a temperature prediction circuitry configured to output the predicted temperature in the processing container, based on at least one of the power supplied to the heater or the virtual power, by using the simulation model of the heat treatment apparatus, and the adjustment circuitry is configured to determine the virtual power at which the predicted temperature of the processing target substrate inside the processing container approaches the set temperature in the processing container, by using the simulation model to which a transmittance of the cumulative film adhering inside the processing container is applied; and adjust the power supplied to the heater based on the predicted temperature and the virtual power.

* * * * *